(12) United States Patent
Ng et al.

(10) Patent No.: US 10,840,246 B2
(45) Date of Patent: Nov. 17, 2020

(54) INTEGRATED CIRCUIT HAVING A VERTICAL POWER MOS TRANSISTOR

(71) Applicant: Taiwan Semiconductor Manufacturing Company, Ltd., Hsinchu (TW)

(72) Inventors: Chun-Wai Ng, Hsinchu (TW); Hsueh-Liang Chou, Jhubei (TW); Po-Chih Su, New Taipei (TW); Ruey-Hsin Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/405,067

(22) Filed: May 7, 2019

(65) Prior Publication Data

US 2019/0267377 A1    Aug. 29, 2019

Related U.S. Application Data

(60) Continuation of application No. 15/801,724, filed on Nov. 2, 2017, now Pat. No. 10,304,829, which is a
(Continued)

(51) Int. Cl.
*H01L 29/78* (2006.01)
*H01L 27/092* (2006.01)
(Continued)

(52) U.S. Cl.
CPC .... *H01L 27/0922* (2013.01); *H01L 21/26513* (2013.01); *H01L 21/30604* (2013.01); *H01L 21/76224* (2013.01); *H01L 21/82385* (2013.01); *H01L 21/823418* (2013.01); *H01L 21/823437* (2013.01); *H01L 21/823481* (2013.01); *H01L 21/823487* (2013.01); *H01L 21/823878* (2013.01); *H01L 21/823885* (2013.01);
(Continued)

(58) Field of Classification Search
CPC ................. H01L 27/0922; H01L 29/78; H01L 21/823878; H01L 21/823885; H01L 21/76224; H01L 21/26513; H01L 29/1095; H01L 29/7827; H01L 29/4236; H01L 29/0847
See application file for complete search history.

(56) References Cited

U.S. PATENT DOCUMENTS 5,504,362 A    4/1996    Pelella et al.
5,640,034 A    6/1997    Malhi
(Continued)

FOREIGN PATENT DOCUMENTS

JP    2002520851 A    7/2002
KR    100374074 B1    7/2003
(Continued)

*Primary Examiner* — David Vu
(74) *Attorney, Agent, or Firm* — Slater Matsil, LLP

(57) ABSTRACT

A device includes a vertical transistor comprising a first gate in a first trench, wherein the first gate comprises a dielectric layer and a gate region over the dielectric layer, and a second gate in a second trench, a high voltage lateral transistor immediately adjacent to the vertical transistor and a low voltage lateral transistor, wherein the high voltage lateral transistor is between the vertical transistor and the low voltage lateral transistor.

20 Claims, 27 Drawing Sheets

Related U.S. Application Data continuation of application No. 15/413,271, filed on Jan. 23, 2017, now Pat. No. 9,825,035, which is a continuation of application No. 14/846,753, filed on Sep. 5, 2015, now Pat. No. 9,553,029, which is a division of application No. 13/588,070, filed on Aug. 17, 2012, now Pat. No. 9,130,060, which is a continuation-in-part of application No. 13/546,506, filed on Jul. 11, 2012, now Pat. No. 8,669,611.

(51) Int. Cl.
| | |
|---|---|
| H01L 21/8238 | (2006.01) |
| H01L 21/265 | (2006.01) |
| H01L 21/306 | (2006.01) |
| H01L 21/762 | (2006.01) |
| H01L 21/8234 | (2006.01) |
| H01L 29/423 | (2006.01) |
| H01L 29/66 | (2006.01) |
| H01L 29/06 | (2006.01) |
| H01L 29/08 | (2006.01) |
| H01L 29/10 | (2006.01) |

(52) U.S. Cl.
CPC .. *H01L 21/823892* (2013.01); *H01L 29/0649* (2013.01); *H01L 29/0847* (2013.01); *H01L 29/1095* (2013.01); *H01L 29/4236* (2013.01); *H01L 29/66621* (2013.01); *H01L 29/66666* (2013.01); *H01L 29/78* (2013.01); *H01L 29/7827* (2013.01); *H01L 29/42364* (2013.01); *H01L 29/7813* (2013.01)

(56) References Cited

U.S. PATENT DOCUMENTS

| | | | |
|---|---|---|---|
| 5,814,858 | A | 9/1998 | Williams |
| 5,920,778 | A | 7/1999 | Roesner et al. |
| 6,177,704 | B1 | 1/2001 | Suzuki et al. |
| 6,251,730 | B1 | 6/2001 | Luo |
| 6,525,375 | B1 | 2/2003 | Yamaguchi et al. |
| 6,710,403 | B2 | 3/2004 | Sapp |
| 6,800,904 | B2 | 10/2004 | Fujishima et al. |
| 7,053,463 | B2 | 5/2006 | Patti |
| 7,253,474 | B2 | 8/2007 | Denison et al. |
| 7,282,406 | B2 | 10/2007 | Grivna et al. |
| 7,446,375 | B2 | 11/2008 | Xu et al. |
| 7,843,004 | B2 | 11/2010 | Darwish |
| 7,884,440 | B2 | 2/2011 | Chung |
| 7,910,984 | B2 | 3/2011 | Yamaguchi et al. |
| 7,968,936 | B2 | 6/2011 | Denison et al. |
| 8,072,028 | B2 | 12/2011 | Krumrey et al. |
| 8,502,308 | B2 * | 8/2013 | Schrems ............ H01L 29/1087 257/337 |
| 8,541,862 | B2 | 9/2013 | Yang et al. |
| 8,637,370 | B2 | 1/2014 | Verma et al. |
| 8,669,611 | B2 | 3/2014 | Ng et al. |
| 2001/0023961 | A1 | 9/2001 | Hshieh et al. |
| 2001/0025961 | A1 | 10/2001 | Nakamura et al. |
| 2001/0041407 | A1 | 11/2001 | Brown |
| 2001/0052617 | A1 | 12/2001 | Kitada et al. |
| 2002/0102795 | A1 | 8/2002 | Calafut |
| 2002/0187597 | A1 | 12/2002 | Ninomiya |
| 2003/0193067 | A1 | 10/2003 | Kim et al. |
| 2004/0108567 | A1 | 6/2004 | Denison et al. |
| 2005/0128320 | A1 | 6/2005 | Sakimura |
| 2005/0153497 | A1 | 7/2005 | Bencuya et al. |
| 2005/0167742 | A1 | 8/2005 | Challa et al. |
| 2005/0191794 | A1 | 9/2005 | Herrick et al. |
| 2006/0030142 | A1 | 2/2006 | Grebs et al. |
| 2006/0060916 | A1 | 3/2006 | Girdhar et al. |
| 2006/0209887 | A1 | 9/2006 | Bhalla et al. |
| 2007/0215939 | A1 | 9/2007 | Xu et al. |
| 2008/0073707 | A1 | 3/2008 | Darwish et al. |
| 2008/0135921 | A1 | 6/2008 | Murase et al. |
| 2008/0237706 | A1 | 10/2008 | Williams et al. |
| 2009/0140343 | A1 | 6/2009 | Feilchenfeld et al. |
| 2009/0166721 | A1 | 7/2009 | Denison et al. |
| 2010/0006935 | A1 | 1/2010 | Huang et al. |
| 2012/0068248 | A1 | 3/2012 | Kawaguchi |
| 2012/0181575 | A1 | 7/2012 | Pfirsch |
| 2012/0217540 | A1 | 8/2012 | Hirler |
| 2013/0328123 | A1 | 12/2013 | Chen et al. |
| 2014/0162422 | A1 | 6/2014 | Ng et al. |
| 2017/0194483 | A1 | 7/2017 | Ng et al. |

FOREIGN PATENT DOCUMENTS

| | | |
|---|---|---|
| KR | 20050058983 A | 6/2005 |
| KR | 100714930 B1 | 5/2007 |
| WO | 0003427 A1 | 1/2000 |
| WO | 03096428 A1 | 11/2003 |
| WO | 2004064148 A1 | 7/2004 |

* cited by examiner

US 10,840,246 B2

1

INTEGRATED CIRCUIT HAVING A VERTICAL POWER MOS TRANSISTOR

PRIORITY CLAIM AND CROSS-REFERENCE

This application is a continuation of U.S. patent application Ser. No. 15/801,724, entitled "Integrated Circuit Having a Vertical Power MOS Transistor," filed on Nov. 2, 2017, a continuation of U.S. patent application Ser. No. 15/413,271, entitled "Integrated Circuit Having a Vertical Power MOS Transistor," filed on Jan. 23, 2017 and issued as U.S. Pat. No. 9,825,035 on Nov. 21, 2017, which is a continuation of U.S. patent application Ser. No. 14/846,753, entitled "Integrated Circuit Having a Vertical Power MOS Transistor," filed on Sep. 5, 2015 and issued as U.S. Pat. No. 9,553,029 on Jan. 24, 2017 which is a divisional of U.S. patent application Ser. No. 13/588,070, entitled "Integrated Circuit Having a Vertical Power MOS Transistor," filed on Aug. 17, 2012 and issued as U.S. Pat. No. 9,130,060 on Sep. 8, 2015 which is a continuation-in-part of U.S. patent application Ser. No. 13/546,506, entitled "Apparatus and Method for Power MOS Transistor," filed on Jul. 11, 2012 and issued as U.S. Pat. No. 8,669,611 on Mar. 11, 2014, all of which applications are incorporated herein by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, low gate-to-drain capacitance and low on resistance of transistors may be desirable for power applications. In addition, it is desirable to integrate vertical power transistors with lateral power transistors on a same semiconductor die.

As semiconductor technologies evolve, metal oxide semiconductor field effect transistors (MOSFET) have been widely used in today's integrated circuits. MOSFETs are voltage controlled devices. When a control voltage is applied to the gate a MOSFET and the control voltage is greater than the threshold of the MOSFET, a conductive channel is established between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; the other is p-channel MOSFETs. According to the structure difference, MOSFETs can be further divided into two sub-categories, namely trench power MOSFETs and lateral power MOSFETs. In an n-channel trench power MOSFET, a p-body region is employed to form a channel coupled between the source region formed over the p-body region and the drain region formed under the p-body region. Furthermore, in the trench power MOSFET, the drain and source are placed on opposite sides of a wafer. There may be a trench structure comprising a gate electrode formed between the drain and the source of the trench power MOSFET.

Trench power MOSFETs are commonly known as vertical power MOSFETs. Vertical power MOSFETs have widely used in high voltage and current applications due to their low gate drive power, fast switching speed and lower on resistance.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, an integrated circuit having a quasi-vertical power metal oxide semiconductor (MOS) transistor device and a plurality of lateral MOS transistors including high voltage MOS transistors and low voltage MOS transistors. The embodiments of the disclosure may also be applied, however, to a variety of semiconductor devices. Hereinafter, various embodiments will be explained in detail with reference to the accompanying drawings.

Figure 1:
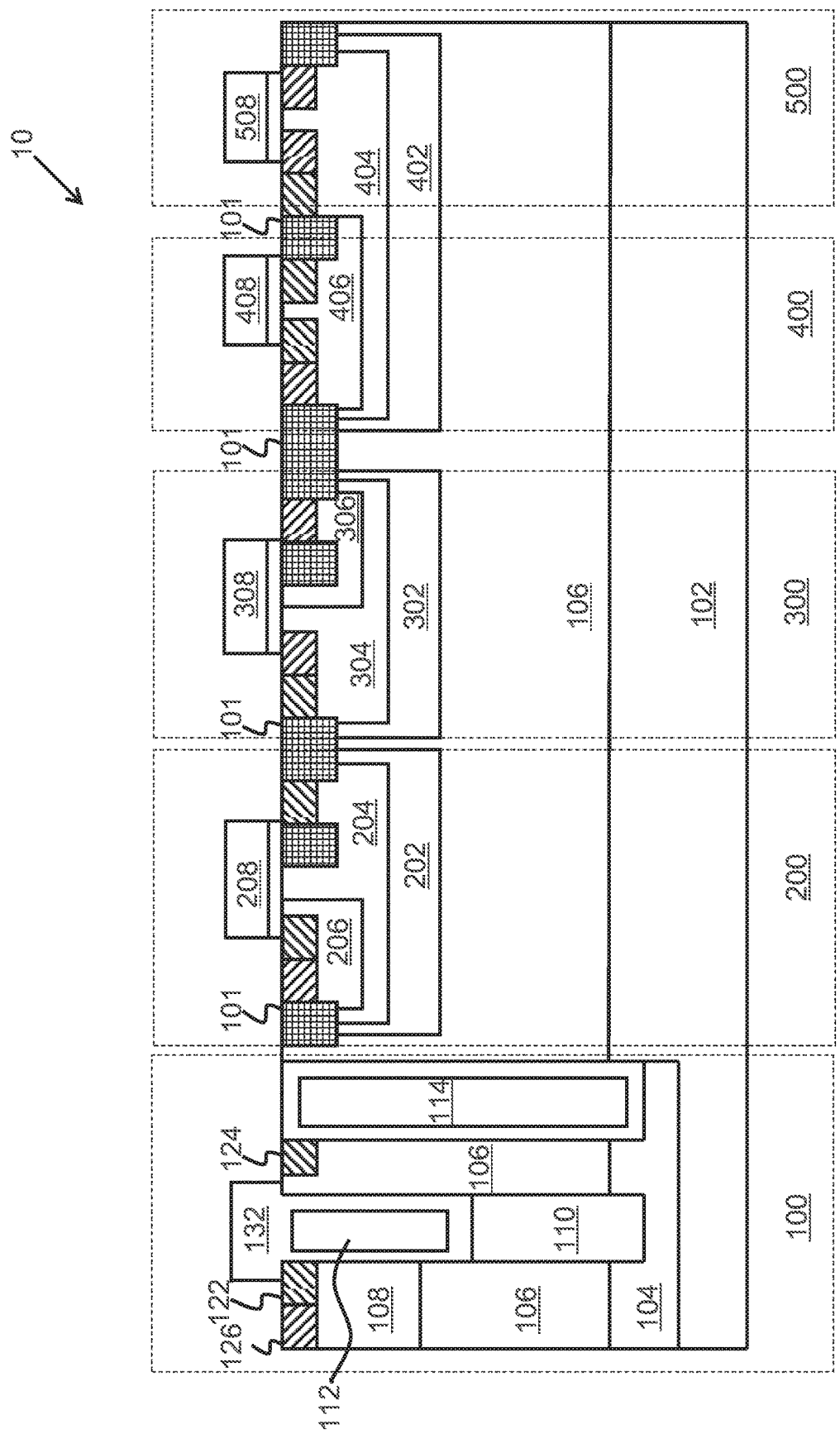
FIG. 1 illustrates a cross sectional view of a semiconductor device comprising a quasi-vertical trench MOS transistor in accordance with an embodiment.

FIG. 1 illustrates a cross sectional view of a semiconductor device comprising a quasi-vertical trench MOS transistor in accordance with an embodiment. The semiconductor device 10 includes four regions, namely a first region 100 for forming a quasi-vertical trench MOS transistor, a second region 200 for forming a high voltage NMOS device having a scalable channel length, a third region 300 for forming a high voltage PMOS device, a fourth region 400 for forming a low voltage NMOS device and a fifth region 500 for forming a low voltage PMOS device. Each of the regions 100, 200, 300, 400 and 500 are defined by isolation regions such as shallow trench isolation (STI) regions 101. Alternatively, field oxides can be formed as isolation regions.

The quasi-vertical trench MOS transistor 100 includes a substrate 102 with a first conductivity type. In accordance with an embodiment, the first conductivity type is P-type. The quasi-vertical trench MOS transistor 100 further includes an N-type buried layer (NBL) 104 formed over the substrate 102 and an N-type epitaxial layer 106 formed over the NBL layer 104. The quasi-vertical trench MOS transistor 100 further comprises a first trench comprising an oxide region 110 and a gate region 112. As shown in FIG. 1, the gate region 112 is formed over the oxide region 110. The quasi-vertical trench MOS transistor 100 may further comprise a P-type body (PB) region 108 formed in the N-type epitaxial layer 106, a P+ region 126, a first N+ region 122 and a second N+ region 124.

As shown in FIG. 1, the P+ region 126 and the first N+ region 122 are formed in the PB region 108. The second N+ region 124 is formed in the N-type epitaxial layer 106. In accordance with an embodiment, the first N+ region 122 is a source region of the quasi-vertical trench MOS transistor 100. The second N+ region 124 is a drain region of the quasi-vertical trench MOS transistor 100. The PB region 108 is a channel coupled between the source and drain of the quasi-vertical trench MOS transistor 100. As shown in FIG. 1, the first N+ region 122 and the second N+ region 124 are formed on opposite sides of the gate region 112. The second N+ region 124 functions as the drain region, which is coupled to the channel region (PB region 108) through the N-type epitaxial layer 106 and the NBL layer 104.

The quasi-vertical trench MOS transistor 100 comprises a second trench having a same depth as the first trench. In particular, the second trench comprises a deep trench 114 and an accumulation layer (not shown) formed along the sidewall of the deep trench 114. As shown in FIG. 1, the second trench is formed adjacent to the second N+ region 124. In accordance with an embodiment, the deep trench 114 may be electrically coupled to the gate region 112. When a gate control voltage is applied to the gate region 112 as well as the deep trench 114, the gate control voltage may attract majority carriers and generate the accumulation layer (not shown) along the sidewall of the deep trench 114. The accumulation layer may be of more majority carriers. As a result, a low resistance drain current conductive path is built between the NBL layer 104 and the second N+ region 124.

As shown in FIG. 1, despite that the N-type epitaxial layer 106 can carry the drain current from the NBL layer 104 to the second N+ region 124, the resistance of the N-type epitaxial layer 106 is higher than the accumulation layer formed along the sidewall of the deep trench 114. By employing an accumulation layer coupled between the second N+ region 124 and the NBL layer 104, the current transport is improved. In addition, by coupling the NBL layer 104 with the second N+ region 124, the drain current can be picked up from the NBL layer 104. As a result, the drain of the quasi-vertical trench MOS transistor 100 can be placed at the same side as the source.

One advantageous feature of the quasi-vertical MOS transistor 100 is that the quasi-vertical structure shown in FIG. 1 can be easily integrated into lateral fabrication processes. Another advantageous feature of the quasi-vertical MOS transistor 100 is that the accumulation layer formed along the sidewall of the second trench helps to provide a low on resistance channel for the drain current. As a result, the on resistance of the MOS transistor 100 is improved despite that a quasi-vertical structure is employed.

FIG. 1 further illustrates the semiconductor device 10 including a plurality of lateral devices, which are integrated on a same semiconductor substrate (P-type substrate 102) as the quasi-vertical MOS transistor 100. The high voltage NMOS device 200 includes a deep P-Well 202 formed in the N-type epitaxial layer 106. Likewise, the high voltage PMOS device 300 includes a deep P-Well 302. The low voltage NMOS device 400 and the low voltage PMOS device 500 share a deep P-Well 402. As shown in FIG. 1, the deep P-Wells 202, 302 and 402 are formed in the N-type epitaxial layer 106 and separated each other by isolation regions 101 and portions of the N-type epitaxial layer 106 between two adjacent deep P-Wells. The lateral devices 200, 300, 400 and 500 may include other wells, drain/source regions and gate electrodes. The detailed fabrication steps of the lateral devices will be described below with respect to FIGS. 5-15.

One advantageous feature of having the quasi-vertical MOS transistor 100 shown in FIG. 1 is that the quasi-vertical MOS structure can be integrated with lateral MOS devices on a same substrate. As such, the existing lateral device fabrication process may be reused. The existing lateral device fabrication process helps to reduce the cost of fabricating the quasi-vertical MOS transistor 100.

Figure 2:
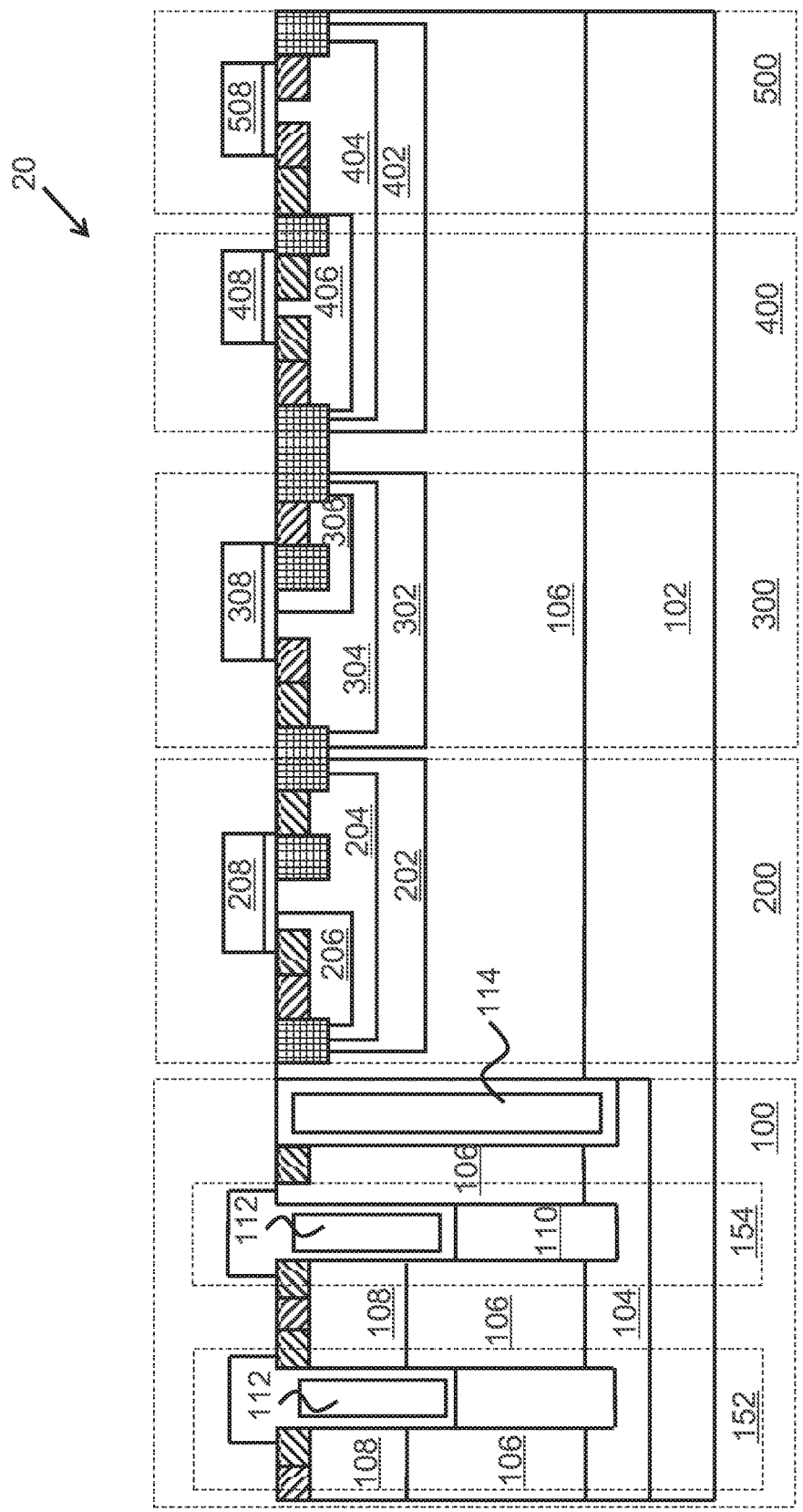
FIG. 2 illustrates a cross sectional view of a semiconductor device comprising a plurality of quasi-vertical MOS transistors in accordance with an embodiment.

FIG. 2 illustrates a cross sectional view of a semiconductor device comprising a plurality of quasi-vertical MOS transistors in accordance with an embodiment. The structure of the semiconductor device 20 is similar to the structure of the semiconductor device 10 shown in FIG. 1 except that a deep trench is employed to provide a low on resistance channel for the drain currents of a plurality of quasi-vertical MOS transistors. In particularly, FIG. 2 illustrates a deep trench providing a low on resistance channel for two quasi-vertical MOS transistors connected in parallel. It should be noted that the deep trench may be capable of providing a conductive channel for a number of quasi-vertical MOS transistors, two quasi-vertical MOS transistors are illustrated for simplicity.

Figure 3:
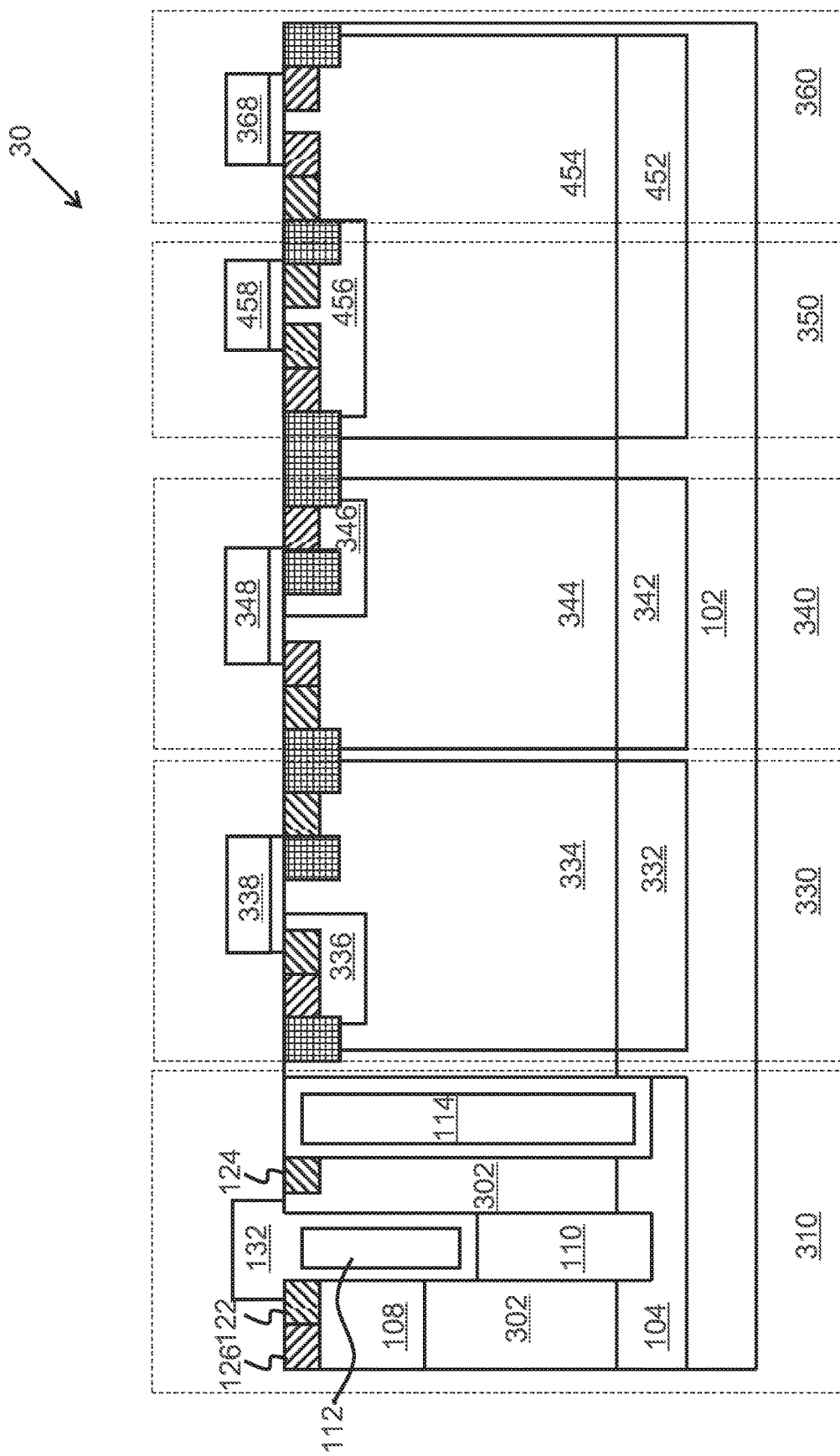
FIG. 3 illustrates a cross sectional view of a semiconductor device comprising a quasi-vertical MOS transistor in accordance with another embodiment.

FIG. 3 illustrates a cross sectional view of a semiconductor device comprising a quasi-vertical MOS transistor in accordance with another embodiment. The structure of the semiconductor device 30 is similar to the structure of the semiconductor device 10 shown in FIG. 1 except that the N-type epitaxial layer can be replaced by a high voltage N-Well formed in a P-type epitaxial layer. The detailed formation and fabrication steps of the semiconductor device 30 will be described below with respect to FIGS. 16-27.

Figure 4:
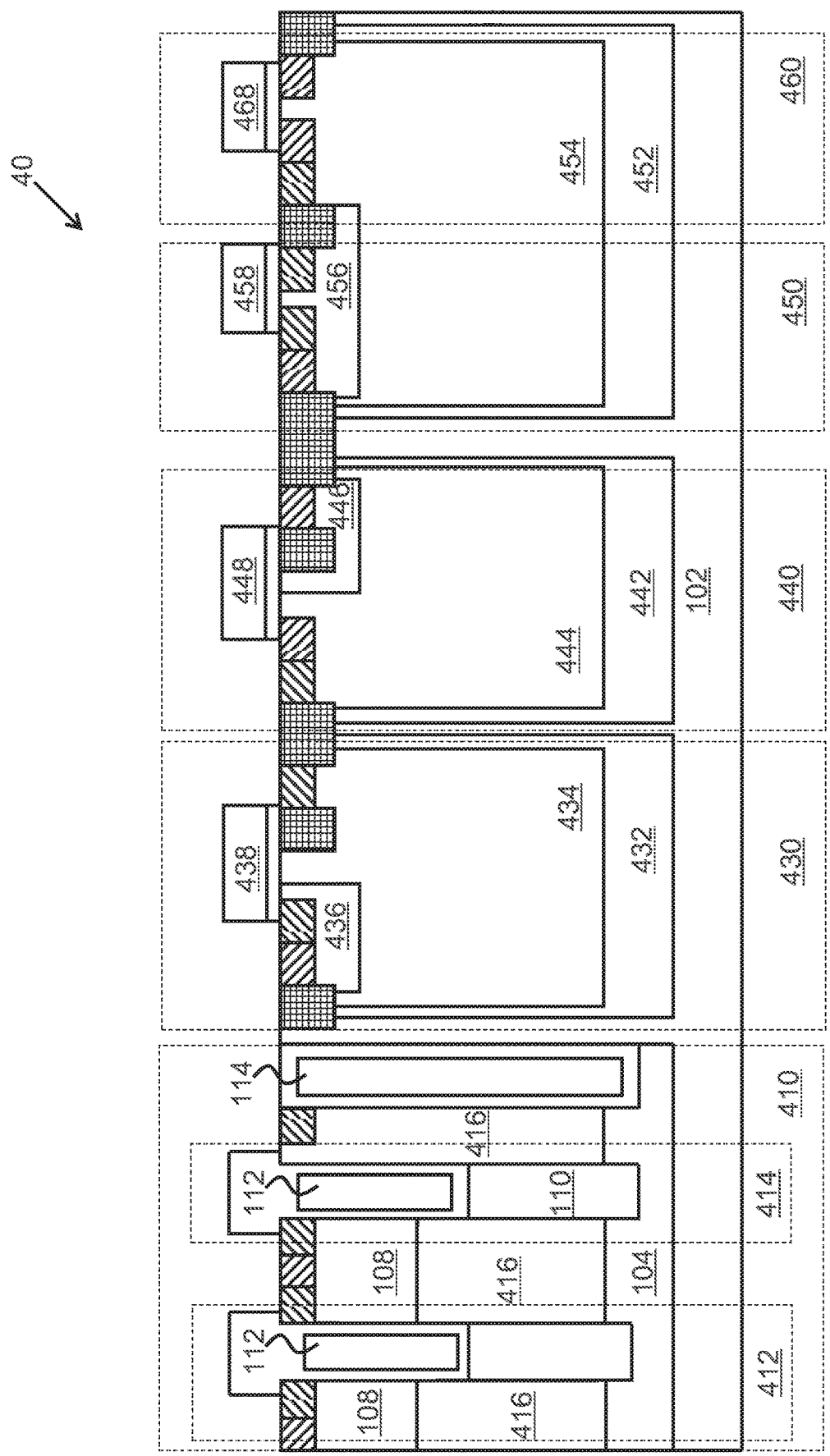
FIG. 4 illustrates a cross sectional view of a semiconductor device comprising a plurality of quasi-vertical MOS transistors in accordance with another embodiment.

FIG. 4 illustrates a cross sectional view of a semiconductor device comprising a plurality of quasi-vertical MOS transistors in accordance with another embodiment. The structure of the semiconductor device 40 is similar to the structure of the semiconductor device 20 shown in FIG. 2 except that the N-type epitaxial layer can be replaced by a high voltage N-Well formed in a P-type epitaxial layer.

Figure 5:
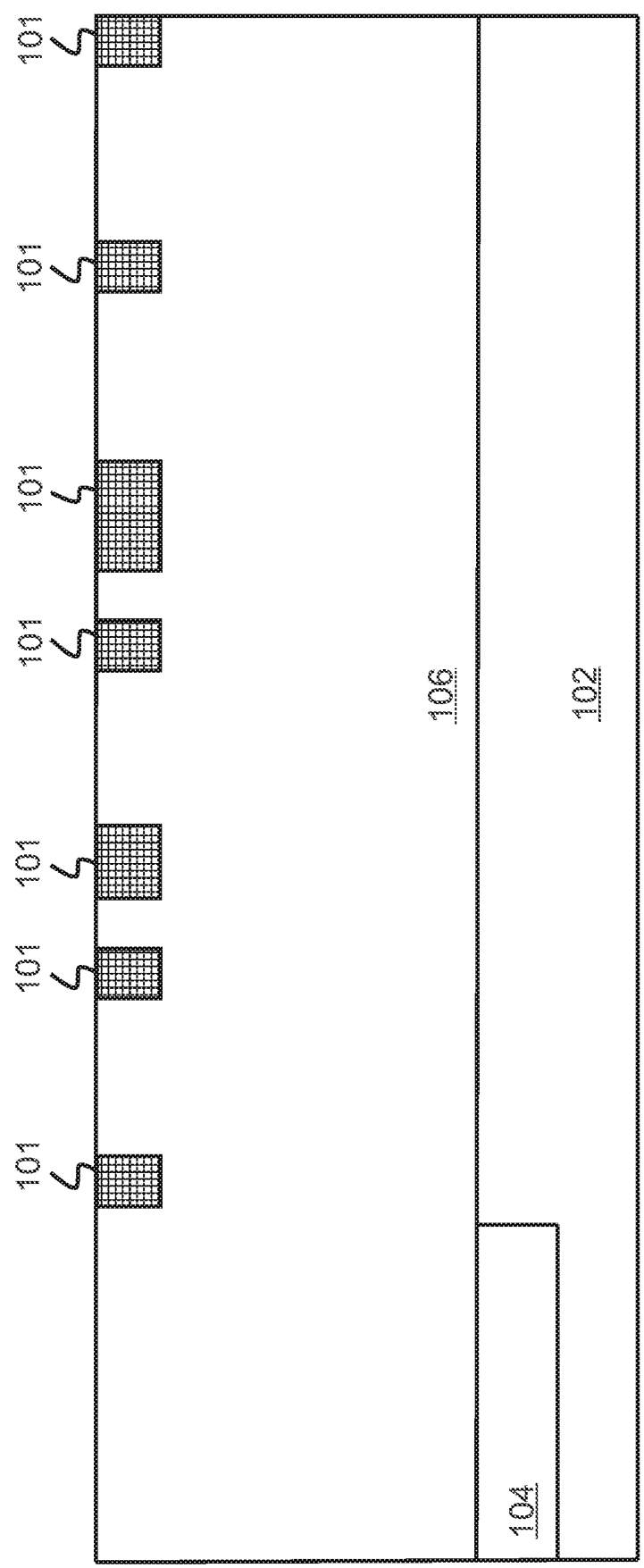
FIG. 5 illustrates a cross sectional view of a semiconductor device after an N-type epitaxial layer and an NBL layer are formed over a substrate in accordance with an embodiment.

FIGS. 5-15 illustrate intermediate steps of fabricating the semiconductor device including a quasi-vertical trench MOS transistor 100 shown in FIG. 1 in accordance with an embodiment. FIG. 5 illustrates a cross sectional view of a semiconductor device after an N-type epitaxial layer, an NBL layer and a plurality of isolation regions are formed over a substrate in accordance with an embodiment. As shown in FIG. 5, the NBL layer 104 is formed over the P-type substrate 102. In particular, the NBL layer 104 is formed in the upper left corner of the P-type substrate 102. The N-type epitaxial layer 106 is formed over the NBL layer 104 and the P-type substrate 102. As shown in FIG. 5, there may be a plurality of isolation regions 101 formed in the N-type epitaxial layer 106.

It should be noted while FIG. 5 illustrates the conductivity of the substrate 102 is P-type, it is merely an example. The substrate 102 may be N-type. A person skilled in the art will recognize that the conductivity type of other layers may change in response to the conductivity type change of the substrate 102.

The substrate 102 may be formed of silicon, silicon germanium, silicon carbide or the like. Alternatively, the substrate 102 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. Other substrates that may be used include multi-layered substrates, gradient substrates, hybrid orientation substrates and the like.

The NBL layer 104 may be formed by implanting N-type doping materials such as phosphorous or the like into the substrate 102. Alternatively, the NBL layer 104 can be formed by a diffusion process. In accordance with an embodiment, the NBL layer 104 is of a doping density in a range from about $10^{19}/cm^3$ to about $10^{21}/cm^3$.

The N-type epitaxial layer 106 is grown from the NBL layer 104. The epitaxial growth of the N-type epitaxial layer 106 may be implemented by using any suitable semiconductor fabrication processes such as chemical vapor deposition (CVD), ultra-high vacuum chemical vapor deposition (UHV-CVD) and the like. In accordance with an embodiment, the N-type epitaxial layer 106 is of a doping density in a range from about $10^{15}/cm^3$ to about $10^{18}/cm^3$.

The isolation regions 101 may be shallow trench isolation (STI) regions, and may be formed by etching the N-type epitaxial layer 106 to form a trench and filling the trench with a dielectric material as is known in the art. The isolation regions 101 may be filled with a dielectric material such as an oxide material, a high-density plasma (HDP) oxide, or the like, formed by conventional methods known in the art.

Figure 6:
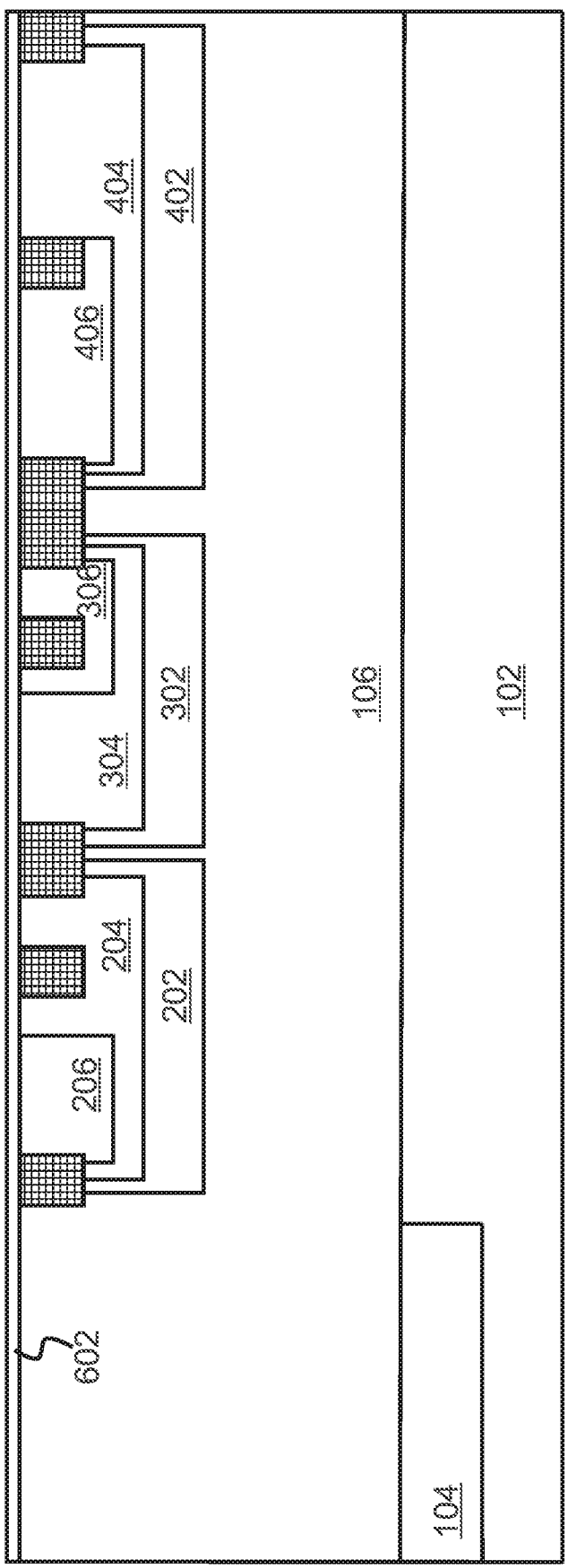
FIG. 6 illustrates a cross sectional view of the semiconductor device shown in FIG. 5 after a dielectric layer is formed over the substrate and a plurality of ion implantation processes are applied to the semiconductor device in accordance with an embodiment.

FIG. 6 illustrates a cross sectional view of the semiconductor device shown in FIG. 5 after a dielectric layer is formed over the substrate and a plurality of ion implantation processes are applied to the semiconductor device in accordance with an embodiment. The dielectric layer 602 is formed over the N-type epitaxial layer 106. The dielectric layer 602 may comprise an oxide layer. The dielectric layer 602 may be formed by any oxidation process, such as wet or dry thermal oxidation in an ambient environment comprising an oxide, $H_2O$, NO, or a combination thereof, or by CVD techniques using tetra-ethyl-ortho-silicate (TEOS) and oxygen as a precursor.

As shown in FIG. 6, three deep P-Wells 202, 302 and 402 are formed in the N-type epitaxial layer 106. The deep P-Wells 202, 302 and 402 are separated by isolation regions as well as the N-type epitaxial layer 106. In accordance with an embodiment, the deep P-Wells may be of a doping concentration in a range from about $10^{16}/cm^3$ and about $10^{19}/cm^3$. The deep P-Wells may be formed by implanting a p-type dopant such as boron. Likewise, three high voltage N-Wells 204, 304 and 404 are formed in the deep P-Wells 202, 302 and 402 respectively. The high voltage N-Wells may be formed by implanting an n-type dopant such as phosphorus at a doping concentration in a range from about $10^{15}/cm^3$ and about $10^{18}/cm^3$.

FIG. 6 further illustrates a 5V P-Well 206 formed in the high voltage N-Well 204, a P-type double diffusion (PDD) region 306 formed in the high voltage N-Well 304 and a 5V P-Well 406 formed in the high voltage N-Well 404. In accordance with an embodiment, the 5V P-Wells may be of a doping concentration in a range from about $10^{15}/cm^3$ and about $10^{18}/cm^3$. The PDD region 306 may be of a doping concentration in a range from about $10^{15}/cm^3$ and about $10^{18}/cm^3$. The 5V P-Wells and PDD region may be formed by implanting a p-type dopant such as boron.

Figure 7:
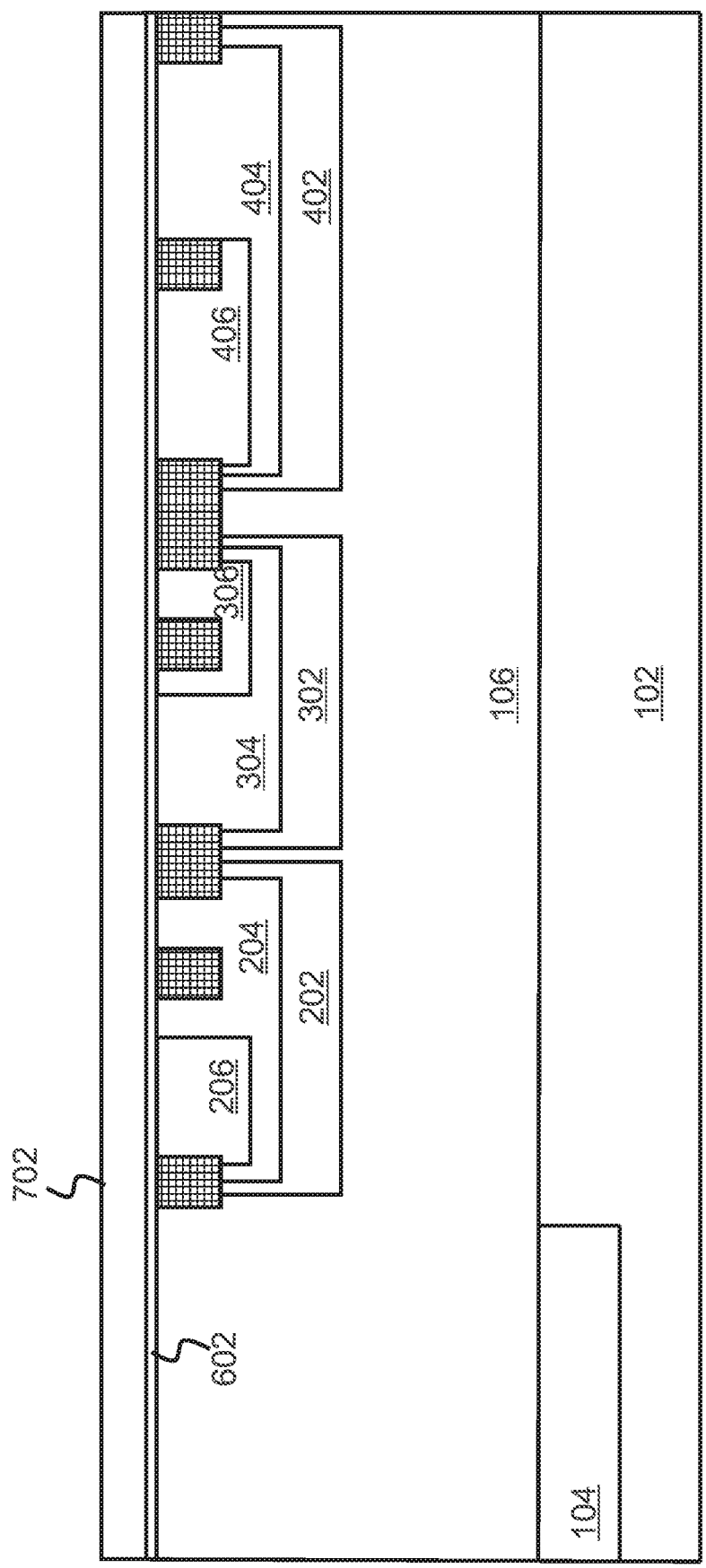
FIG. 7 illustrates a cross sectional view of the semiconductor device shown in FIG. 7 after a hard mask layer is formed over the substrate in accordance with an embodiment.

FIG. 7 illustrates a cross sectional view of the semiconductor device shown in FIG. 7 after a hard mask layer is formed over the substrate in accordance with an embodiment. The hard mask layer 702 is deposited on the dielectric layer 602 in accordance with an embodiment. The hard mask layer 702 may be formed of silicon nitride. The hard mask layer 702 is deposited on top of the dielectric layer 602 through suitable fabrication techniques such as CVD and the like.

Figure 8:
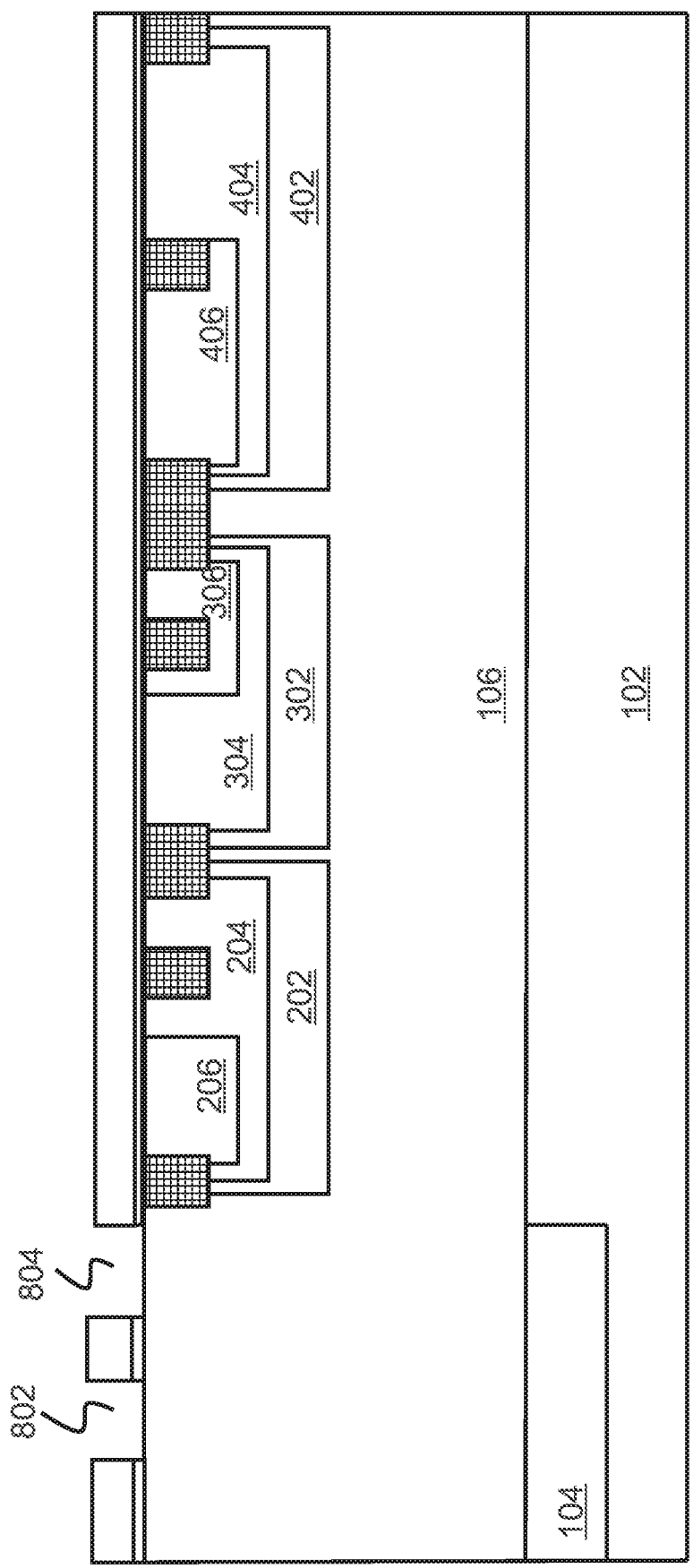
FIG. 8 illustrates a cross sectional view of the semiconductor device shown in FIG. 7 after suitable etching processes are applied to the dielectric layer and the hard mask layer in accordance with an embodiment.

FIG. 8 illustrates a cross sectional view of the semiconductor device shown in FIG. 7 after suitable etching processes are applied to the dielectric layer and the hard mask layer in accordance with an embodiment. The hard mask layer 702 and the dielectric layer 602 are patterned in consideration with the location of the first trench and second trench of the quasi-vertical MOS transistor 100 (shown in FIG. 1). Thereafter, an etching process, such as a reactive ion etch (RIE) or other dry etch, an anisotropic wet etch, or any other suitable anisotropic etch or patterning process, is performed to form the openings 802 and 804 shown in FIG. 8. It should be noted that in accordance with an embodiment, the width of the opening 804 is greater than the width of the opening 802.

Figure 9:
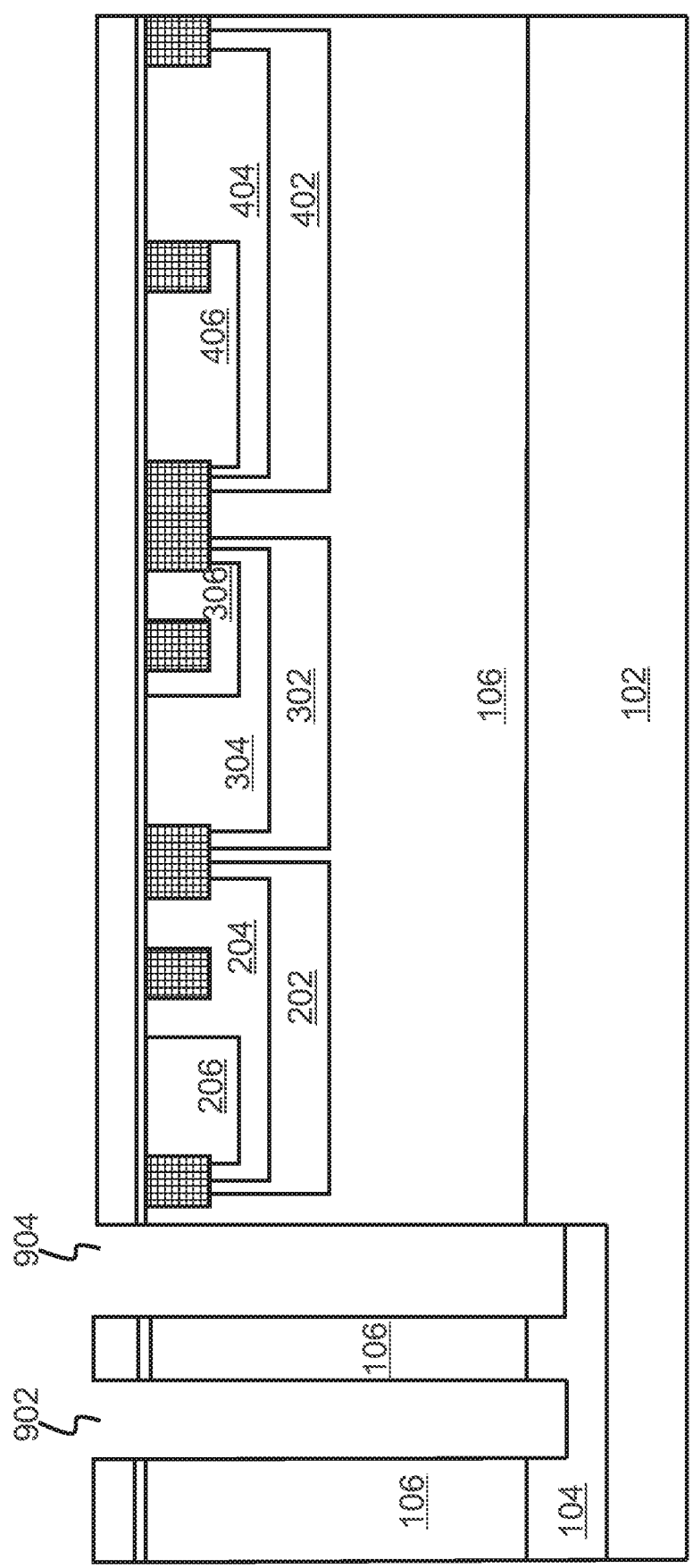
FIG. 9 illustrates a cross sectional view of the semiconductor device shown in FIG. 8 after etching processes are applied to the N-type epitaxial layer in accordance with an embodiment.

FIG. 9 illustrates a cross sectional view of the semiconductor device shown in FIG. 8 after etching processes are applied to the N-type epitaxial layer in accordance with an embodiment. An etching process, such as RIE, dry etch, wet etch, or any other suitable anisotropic etch techniques are applied to the N-type epitaxial layer 106 to form the trench 902 and the trench 904. As shown in FIG. 9, both the first trench 902 and the second trench 904 are formed in a same fabrication step. Such a single step formation of the first trench 902 and the second trench 904 helps to reduce the fabrication cost of the quasi vertical MOS transistor 100.

As shown in FIG. 9, the etching process may etch through the N-type epitaxial layer 106 and partially etch the NBL layer 104. Moreover, FIG. 9 illustrates that the depth of the first trench 902 is approximately equal to the depth of the second trench 904. It should be noted that as shown in FIG. 9, the width of the second trench 904 is greater than the width of the first trench 902. The relatively larger opening of the second trench 904 helps to maintain an opening during a subsequent oxide deposition process. The oxide deposition process will be described in detail below with respect to FIG. 10.

Figure 10:
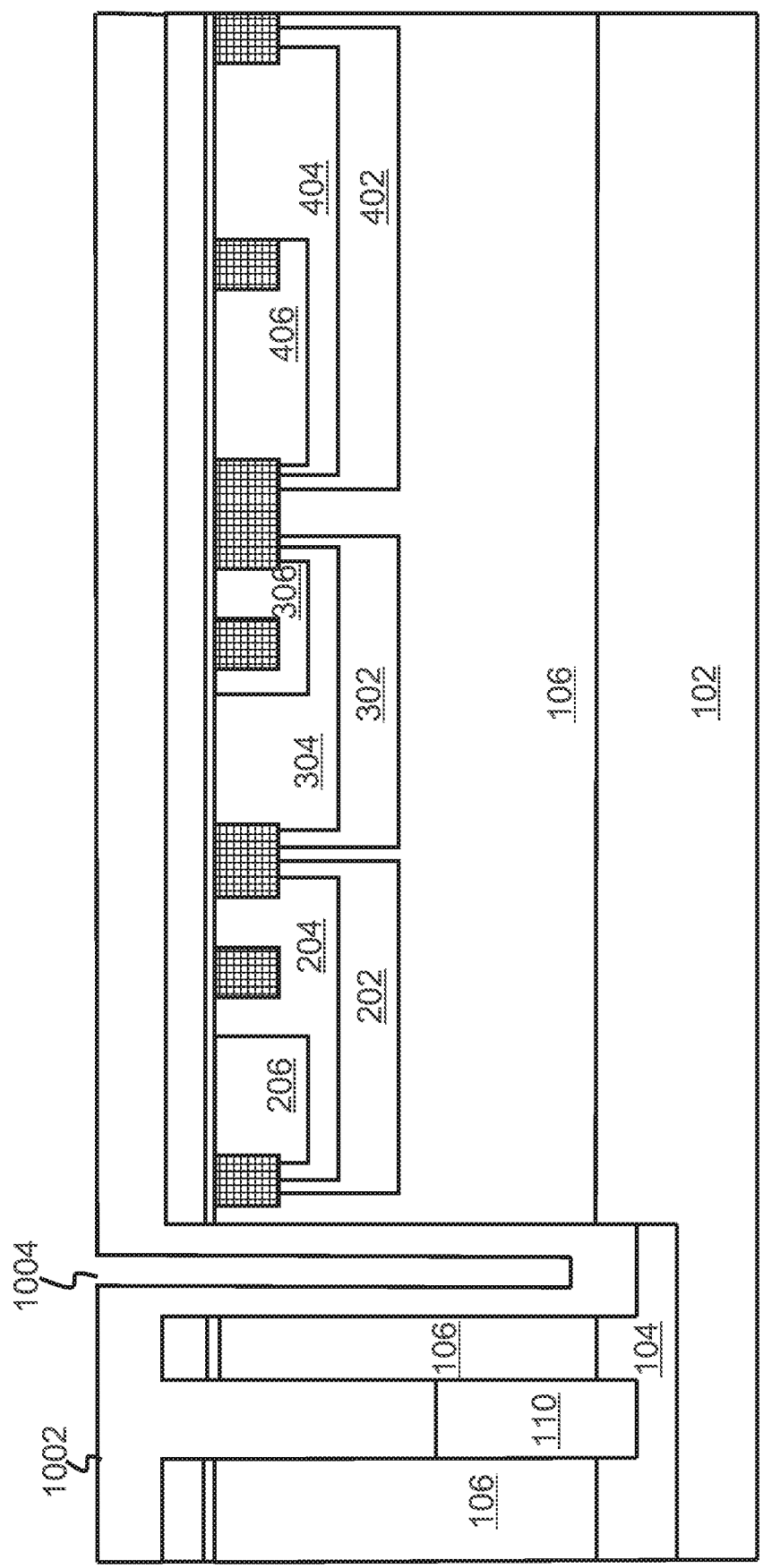
FIG. 10 illustrates a cross sectional view of the semiconductor device shown in FIG. 9 after a dielectric deposition process is applied to the first trench and the second trench in accordance with an embodiment.

FIG. 10 illustrates a cross sectional view of the semiconductor device shown in FIG. 9 after a dielectric deposition process is applied to the first trench and the second trench in accordance with an embodiment. As shown in FIG. 10, a dielectric layer 1002 fills the first trench 902 (shown in FIG. 9), but partially fills the second trench 904. There may be an opening 1004 in the second trench 904 after the dielectric deposition process. As described above with respect to FIG. 9, the width of the second opening 904 is greater than the width of the first opening 902. As a result, by controlling the dielectric deposition process, the dielectric layer 1002 may partially fill the second trench 904.

In accordance with an embodiment, the dielectric layer 1002 may be formed of oxide. Throughout the description, the dielectric layer 1002 may be alternatively referred to as the oxide layer 1002. The oxide layer 1002 may be formed by using suitable thermal treatment techniques, wet treatment techniques or deposition techniques such as PVD, CVD, ALD or the like. It should be noted that the oxide layer 1002 shown in FIG. 10 is merely an example. Other dielectric materials such as such as nitrides, oxynitrides, high-k materials, combinations thereof, and multi-layers thereof may be alternatively used.

Figure 11:
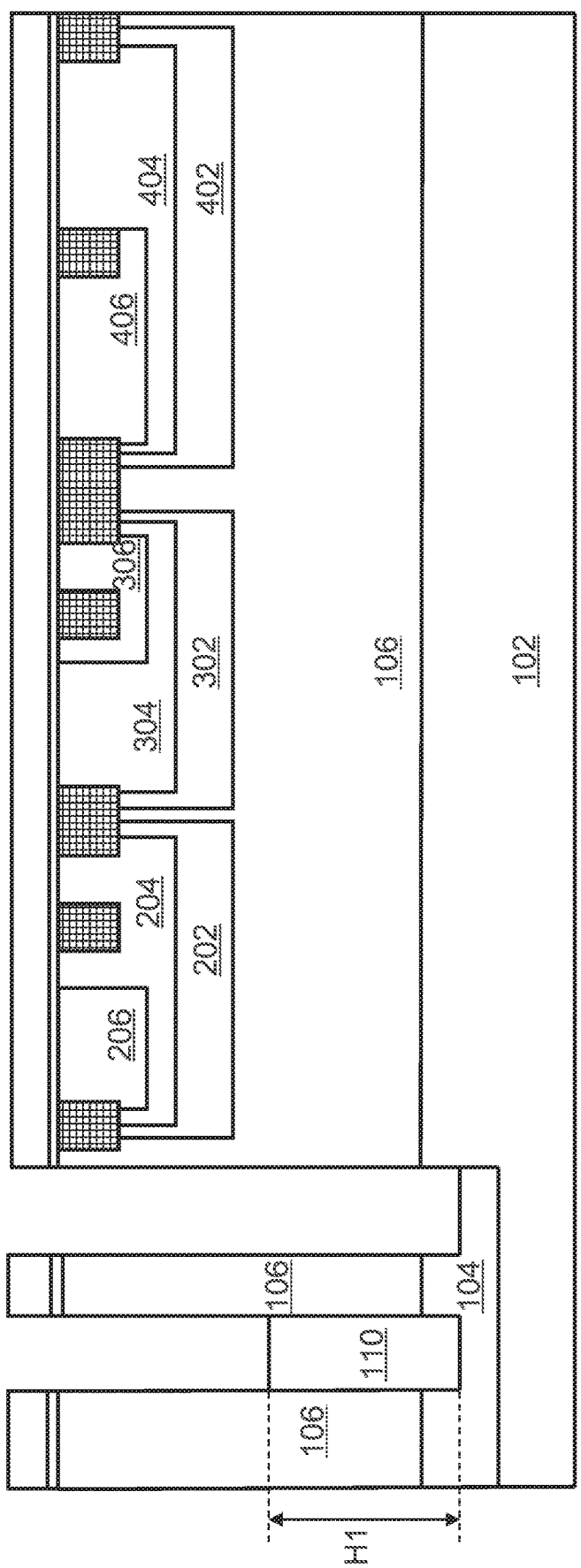
FIG. 11 illustrates a cross sectional view of the semiconductor device shown in FIG. 10 after an etching process is applied to the oxide layer in accordance with an embodiment.

FIG. 11 illustrates a cross sectional view of the semiconductor device shown in FIG. 10 after an etching process is applied to the oxide layer in accordance with an embodiment. An etching process, such as a RIE, an anisotropic wet etch, or any other suitable anisotropic etch process, is performed to remove the upper portion of the oxide layer in the first trench to form the oxide layer 110 shown in FIG. 11.

Moreover, the etching process is so controlled that the oxide layer in the second trench is fully removed. In other words, the second trench is free from oxide. In accordance with an embodiment, the oxide layer 110 shown in FIG. 11 is of a thickness H1. H1 is in a range from about 0.5 um to about 5 um. It should be noted that the dimensions recited through the description are merely examples, and may be changed to different values. It should further be noted that the oxide layer 110 shown in FIG. 11 may function as a field plate, which helps to reduce the surface electrical field.

Furthermore, the reduced surface electrical field along the oxide layer 110 may improve the voltage rating of the quasi vertical MOS transistor 100.

Figure 12:
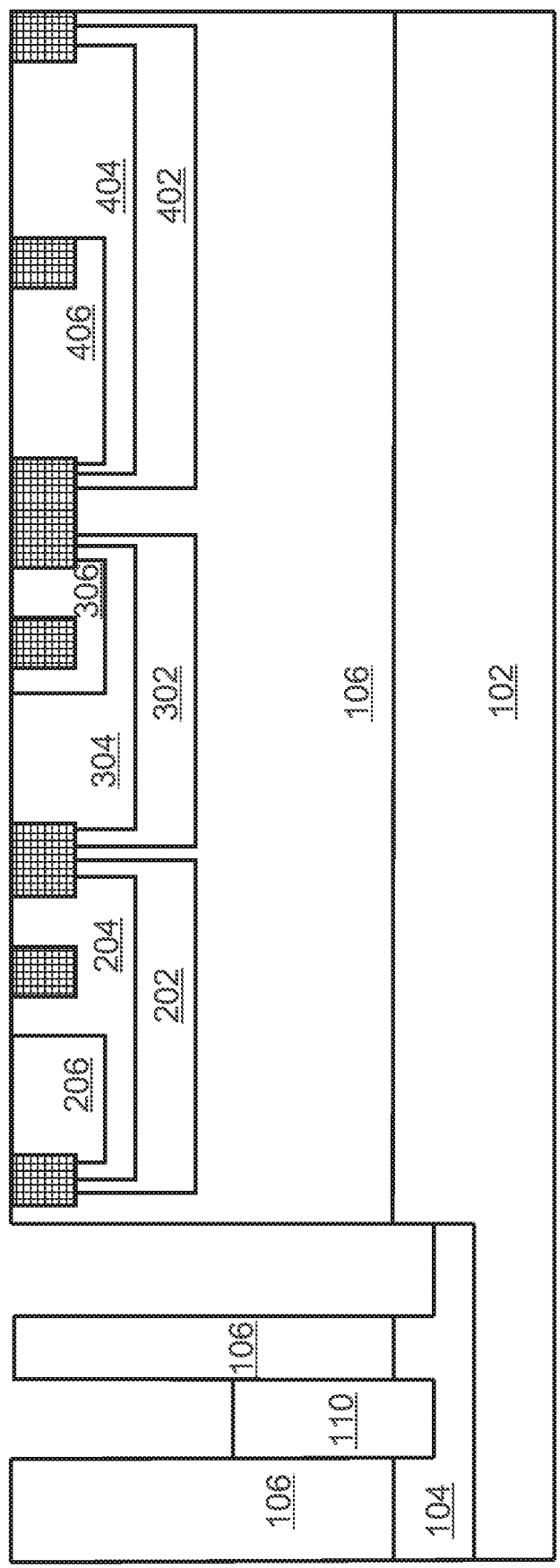
FIG. 12 illustrates a cross sectional view of the semiconductor device shown in FIG. 11 after a hard mask removal process is applied to the top surface of the semiconductor device in accordance with an embodiment.

FIG. 12 illustrates a cross sectional view of the semiconductor device shown in FIG. 11 after a hard mask removal process is applied to the top surface of the semiconductor device in accordance with an embodiment. As shown in FIG. 12, the hard mask layer and the oxide layers shown in FIG. 11 have been removed through a suitable hard mask layer removal process such as a wet etch process. The removal process is applied to the top surface of the semiconductor device until the N-type epitaxial layer 106 is exposed.

Figure 13:
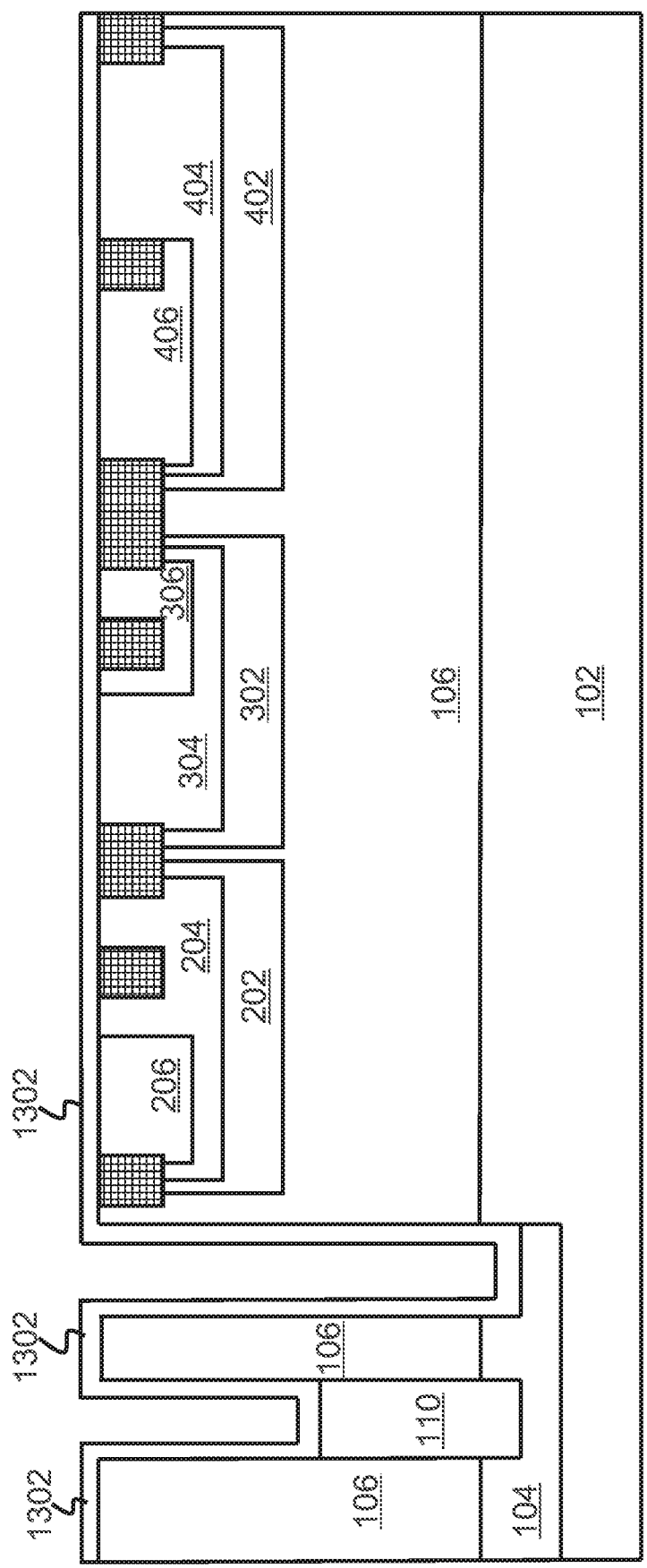
FIG. 13 illustrates a cross sectional view of the semiconductor device shown in FIG. 12 after a gate dielectric layer is formed in the trench as well as the top surface of the semiconductor device in accordance with an embodiment.

FIG. 13 illustrates a cross sectional view of the semiconductor device shown in FIG. 12 after a gate dielectric layer is formed in the trench as well as the top surface of the semiconductor device in accordance with an embodiment. As shown in FIG. 13, the gate dielectric layer 1302 is formed in the first trench, the second trench as well as the top surface of the semiconductor device. The gate dielectric layer 1302 may be formed of commonly used dielectric materials such as oxides, nitrides, oxynitrides, high-k materials, combinations thereof, and multi-layers thereof.

In accordance with an embodiment, the gate dielectric layer 1302 is an oxide layer. The gate dielectric layer 1302 may be formed by using suitable thermal treatment techniques, wet treatment techniques or deposition techniques such as PVD, CVD, ALD or the like.

Figure 14:
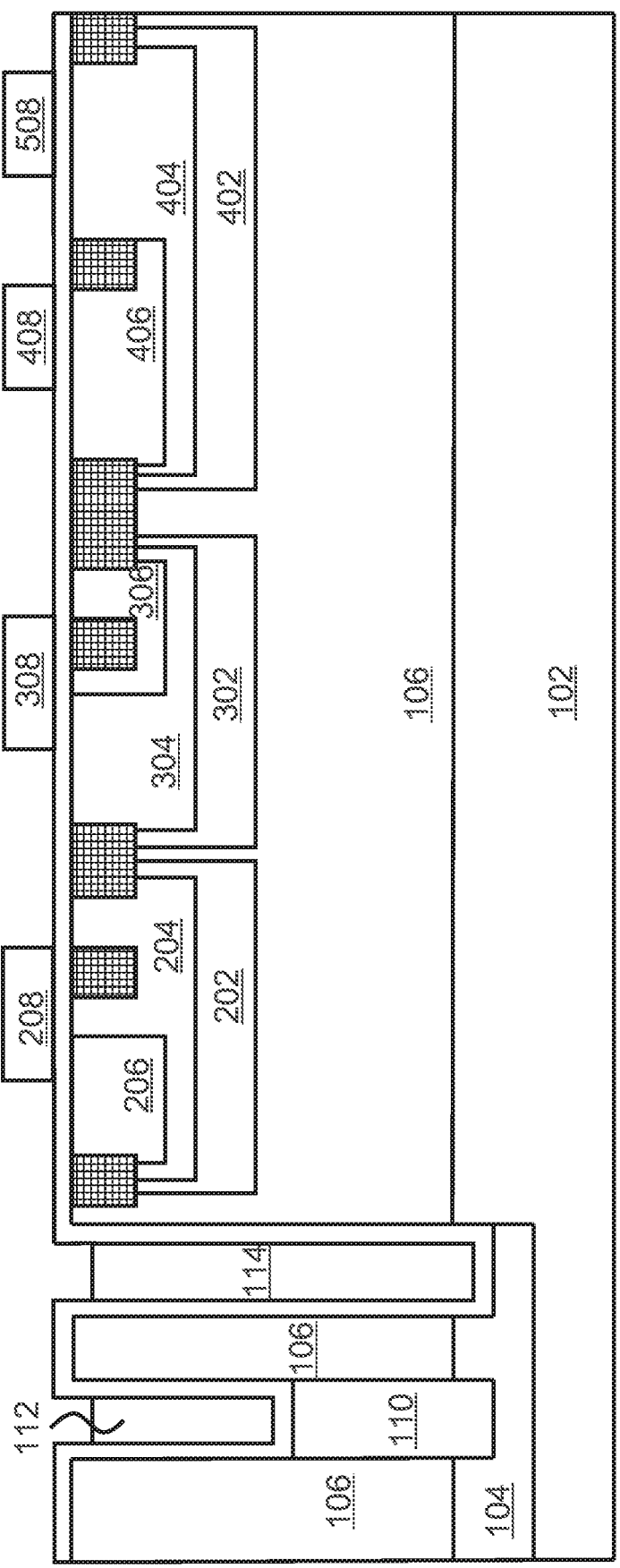
FIG. 14 illustrates a cross sectional view of the semiconductor device shown in FIG. 13 after a gate electrode layer is formed in the trench and a plurality of gate electrodes are formed on the top surface of the semiconductor device in accordance with an embodiment.

FIG. 14 illustrates a cross sectional view of the semiconductor device shown in FIG. 13 after a gate electrode layer is formed in the trench and a plurality of gate electrodes are formed on the top surface of the semiconductor device in accordance with an embodiment. The gate region 112, the deep trench 114, the gate electrodes 208, 308, 408 and 508 may be filled with the same material through the same fabrication process.

The gate region 112, the deep trench 114 the gate electrodes 208, 308, 408 and 508 may comprise a conductive material, such as a metal material (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In accordance with an embodiment, amorphous silicon is deposited and recrystallized to create poly-crystalline silicon (poly-silicon).

In accordance with an embodiment, the gate region 112, the deep trench 114 the gate electrodes 208, 308, 408 and 508 may be formed of poly-silicon. The gate regions (e.g., 112, 208, 308, 408 and 508) and the deep trench 114 may be formed by depositing doped or undoped poly-silicon by low-pressure chemical vapor deposition (LPCVD). In accordance with another embodiment, the gate regions (e.g., 112, 208, 308, 408 and 508) and the deep trench 114 may be formed of metal materials such as titanium nitride, tantalum nitride, tungsten nitride, titanium, tantalum and/or combinations. The metal gate electrode layer may be is formed using suitable deposition techniques such as ALD, CVD, PVD and the like. The above deposition techniques are well known in the art, and hence are not discussed herein.

Figure 15:
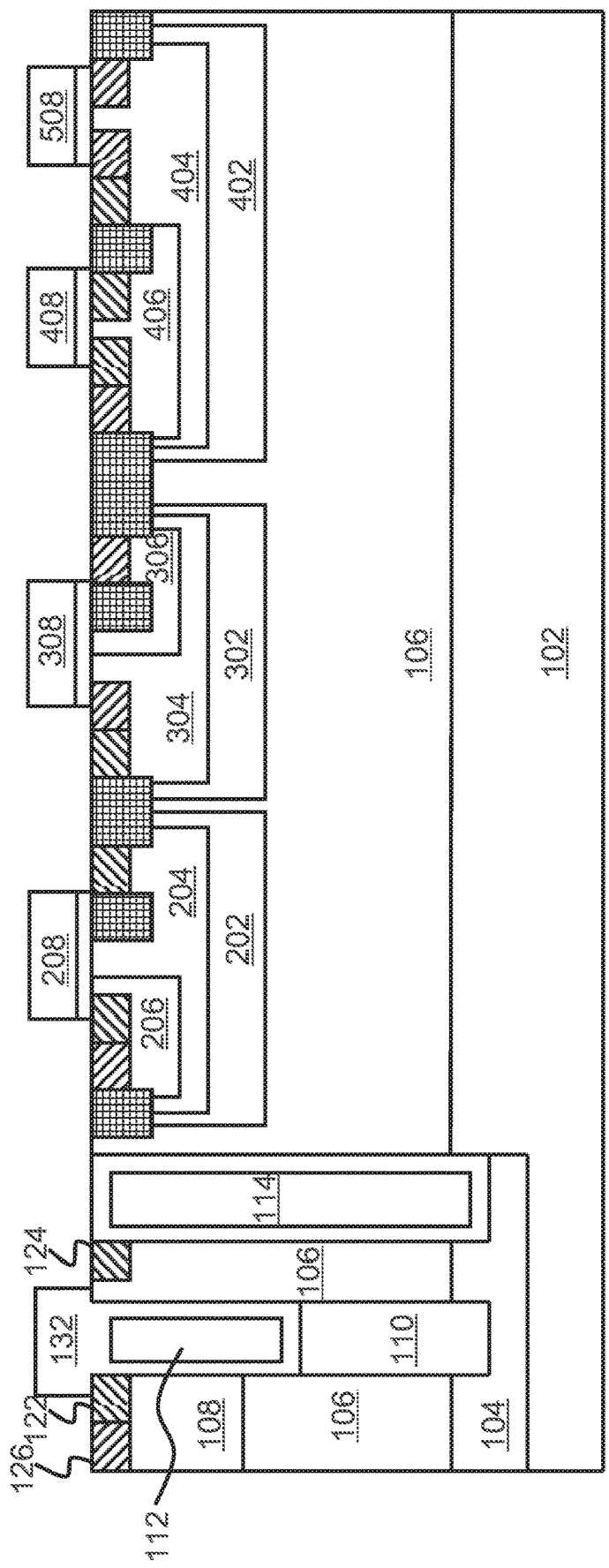
FIG. 15 illustrates a cross sectional view of the semiconductor device shown in FIG. 14 after a variety of ion implantation processes are applied to the top surface of the semiconductor device in accordance with an embodiment.

FIG. 15 illustrates a cross sectional view of the semiconductor device shown in FIG. 14 after a variety of ion implantation processes are applied to the top surface of the semiconductor device in accordance with an embodiment. As shown in FIG. 15, the PB region 108 is formed in the N-type epitaxial layer 106. In accordance with an embodiment, the PB region is of a doping concentration in a range from about $10^{16}$/cm$^3$ and about $10^{18}$/cm$^3$.

A plurality of spacers (not shown) may be formed for their corresponding gate electrodes. The spacers may be formed by blanket depositing one or more spacer layers (not shown) over the gate electrodes and the substrate. The spacer layers may comprise SiN, oxynitride, SiC, SiON, oxide, and the like and may be formed by commonly used methods such as chemical vapor deposition (CVD), plasma enhanced CVD, sputter, and other methods known in the art. The spacer layers may be patterned, such as by isotropically or anisotropically etching, thereby removing the spacer layers from the horizontal surfaces of the structure and forming the spacers.

The P+ region 126 may be formed by implanting a p-type dopant such as boron at a concentration of between about $10^{19}$/cm$^3$ and about $10^{21}$/cm$^3$. The first N+ region 122 is formed over the PB region 108. In accordance with an embodiment, the first N+ region 122 functions as the source of the MOS transistor 100. The source region may be formed by implanting an n-type dopant such as phosphorous at a concentration of between about $10^{19}$/cm$^3$ and about $10^{21}$/cm$^3$. Furthermore, a source contact (not shown) may be formed over the first N+ region 122.

The second N+ region 124 is formed in the N-type epitaxial layer. In accordance with an embodiment, the second N+ region 124 may be the drain of the MOS transistor 100. The drain region may be formed by implanting an n-type dopant such as phosphorous at a concentration of between about $10^{19}$/cm$^3$ and about $10^{21}$/cm$^3$. As shown in FIG. 1, the drain region is formed on the opposite side from the source (the first N+ region 122).

The P+ region 126 may be formed by implanting a p-type dopant such as boron at a concentration of between about $10^{19}$/cm$^3$ and about $10^{21}$/cm$^3$. The P+ region 126 may contact the p-type body of the MOS transistor 100. In order to eliminate the body effect, the P+ region 126 may be coupled to the first N+ region 122 (the source of the MOS transistor 100) directly through the source contact (not shown).

An inter-layer dielectric (ILD) layer (not shown) is formed over the top surface of the semiconductor device shown in FIG. 15. The ILD layer may be formed of silicon nitride doped silicate glass, although other materials such as boron doped phosphor silicate glass or the like may alternatively be utilized. Contact openings (not shown) may be formed in the ILD layer through an etching process. After the etching process, a portion of the ILD layer remains and becomes a gate-to-source dielectric layer 132. In addition, conductive materials are deposited into the opening to form the source contact (not shown).

The N+ and P+ regions of lateral devices having the gate electrodes 208, 308, 408 and 508 may be formed the same fabrication processes as the first N+ region 122, the second N+ region 124 and the P+ region 126. The formation of the N+ and P+ regions of the lateral devices is similar to that of the N+ and P+ regions of the quasi vertical MOS transistor 100, and hence is not discussed in further detail herein to avoid repetition.

FIGS. 16-27 illustrate intermediate steps of fabricating the semiconductor device including a quasi-vertical trench MOS transistor 100 shown in FIG. 3 in accordance with an embodiment. The fabrication steps shown in FIGS. 16-27 are similar to the fabrication steps shown in FIG. 5-15 except that the N-type epitaxial layer shown in FIG. 5 is replaced by a high voltage N-Well formed in a P-type epitaxial layer in FIG. 16.

Figure 16:
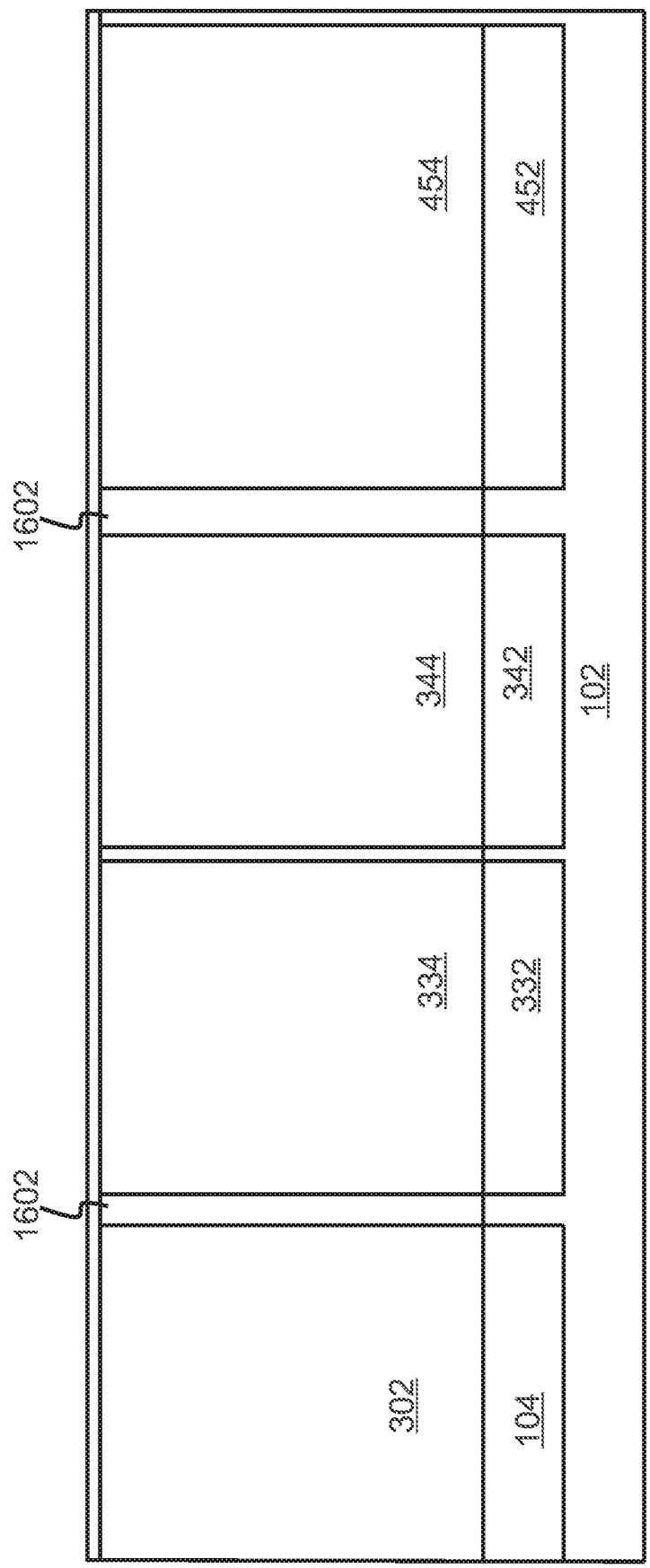
FIGS. 16-27 illustrate intermediate steps of fabricating the semiconductor device including a quasi-vertical trench MOS transistor 100 shown in FIG. 3 in accordance with an embodiment.
Figure 17:
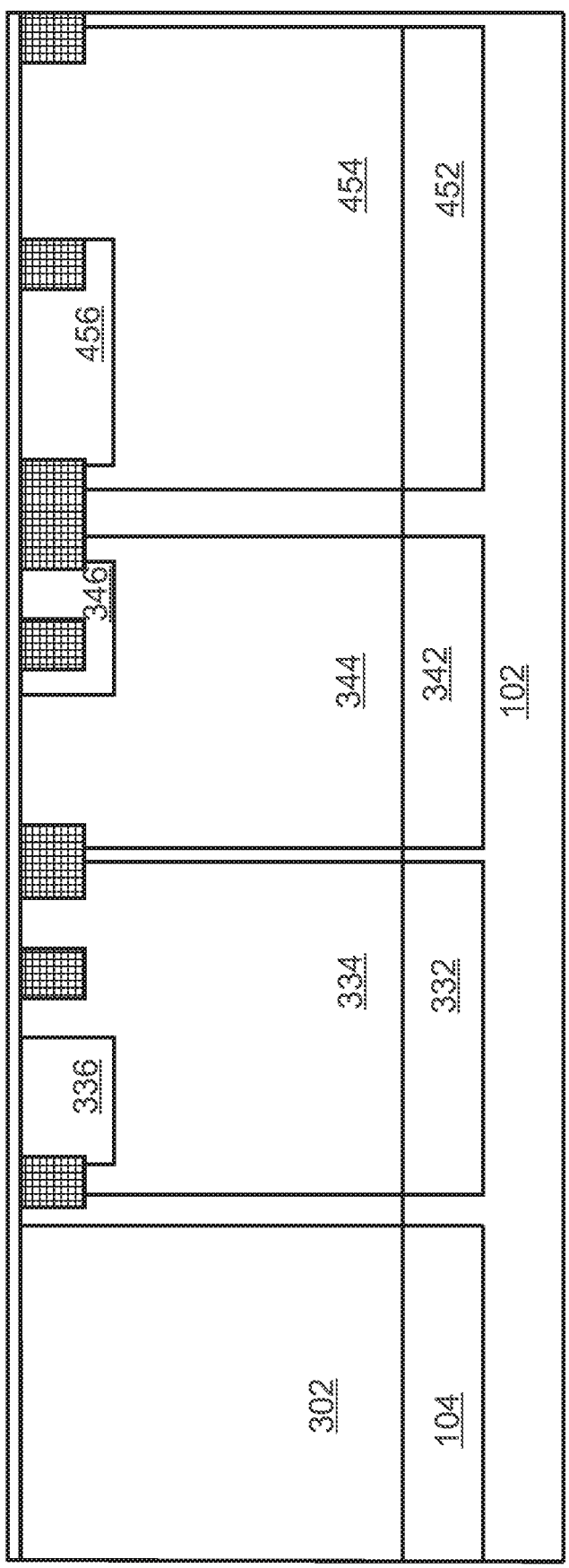
Figure 18:
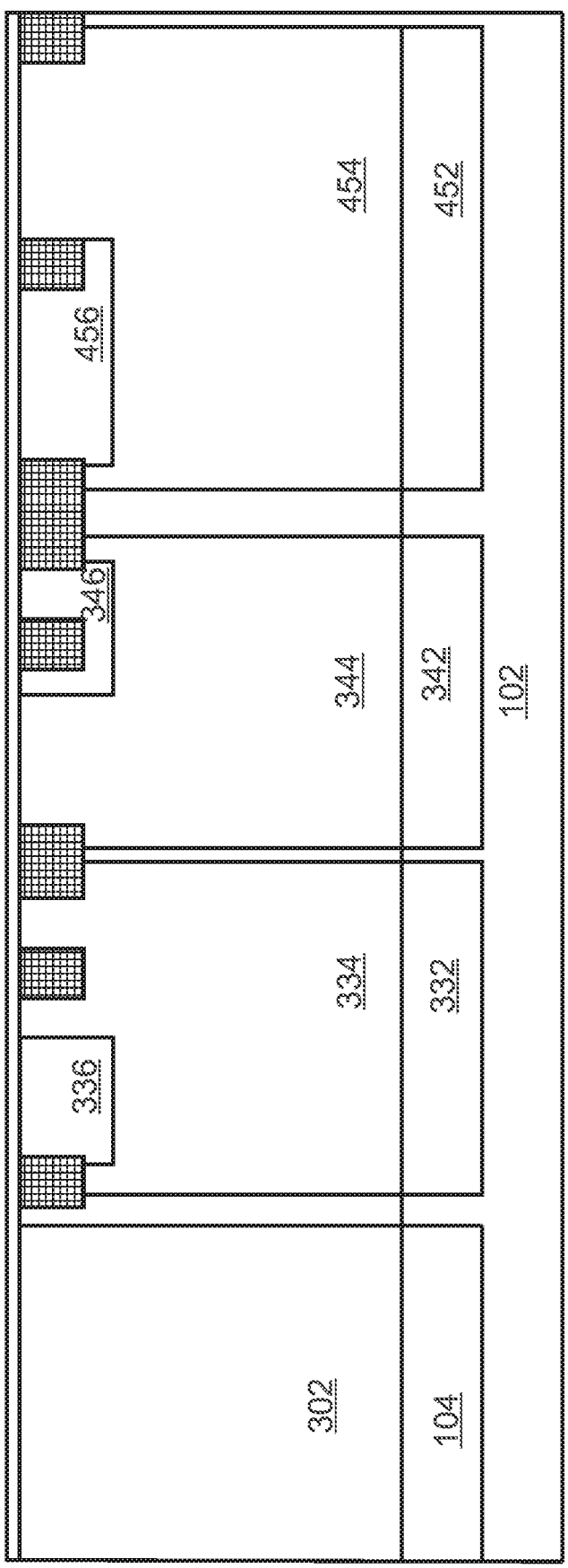
Figure 19:
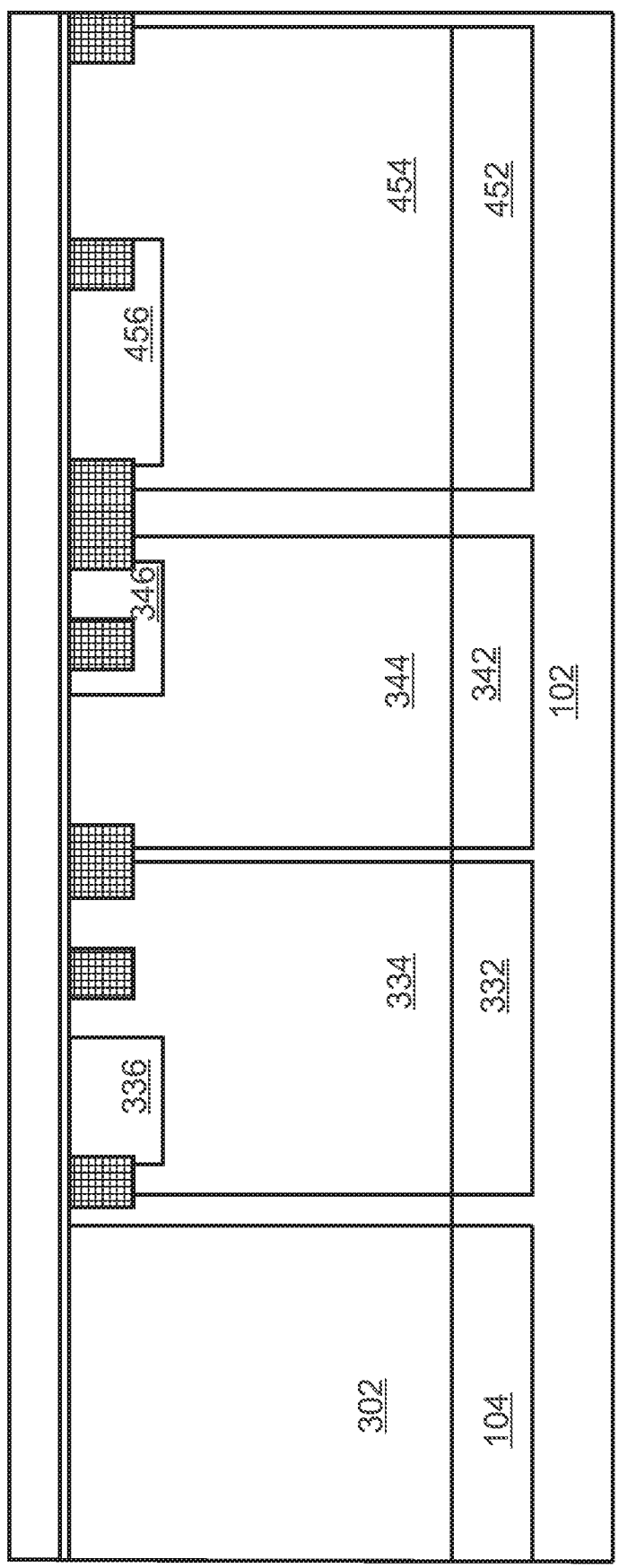
Figure 20:
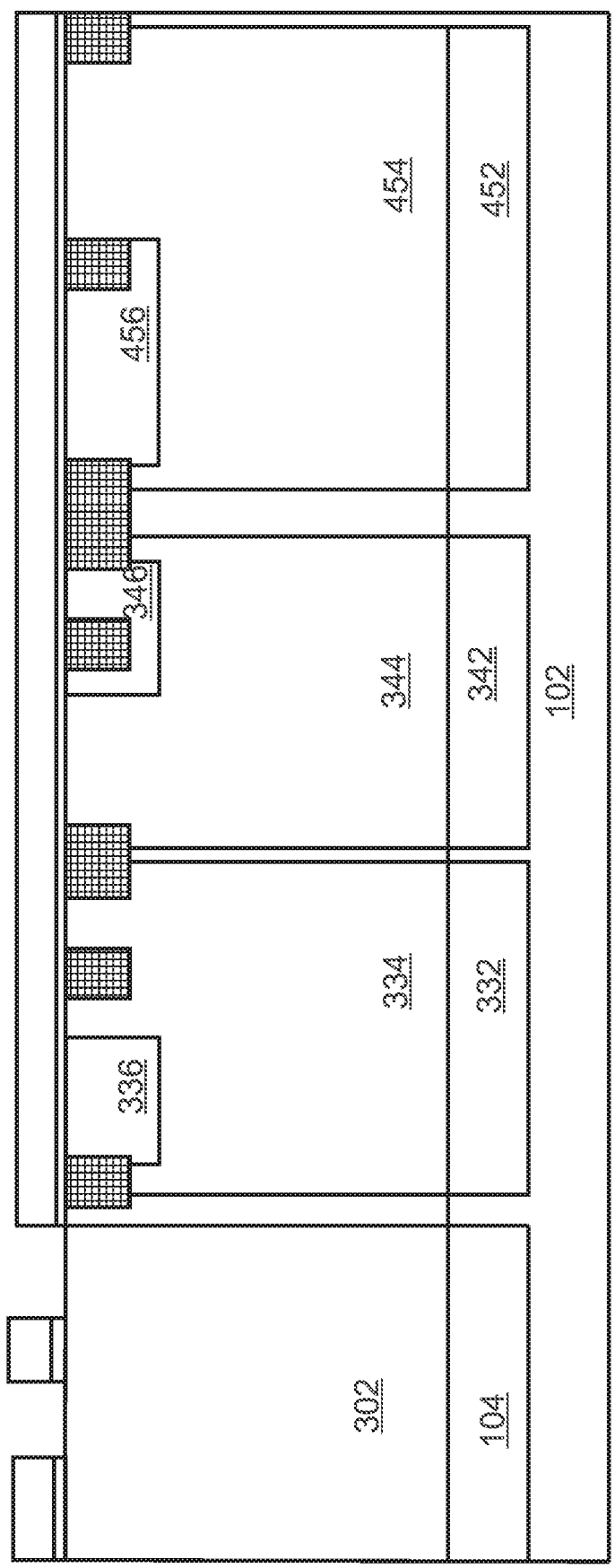
Figure 21:
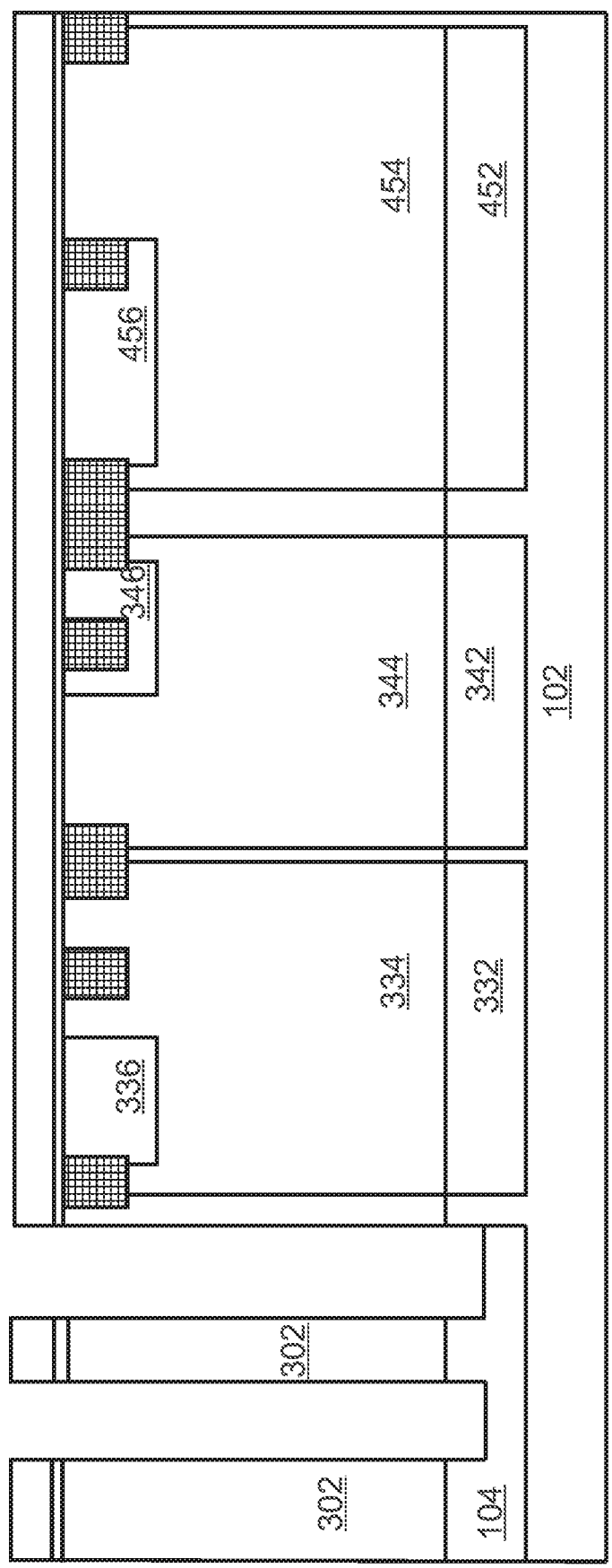
Figure 22:
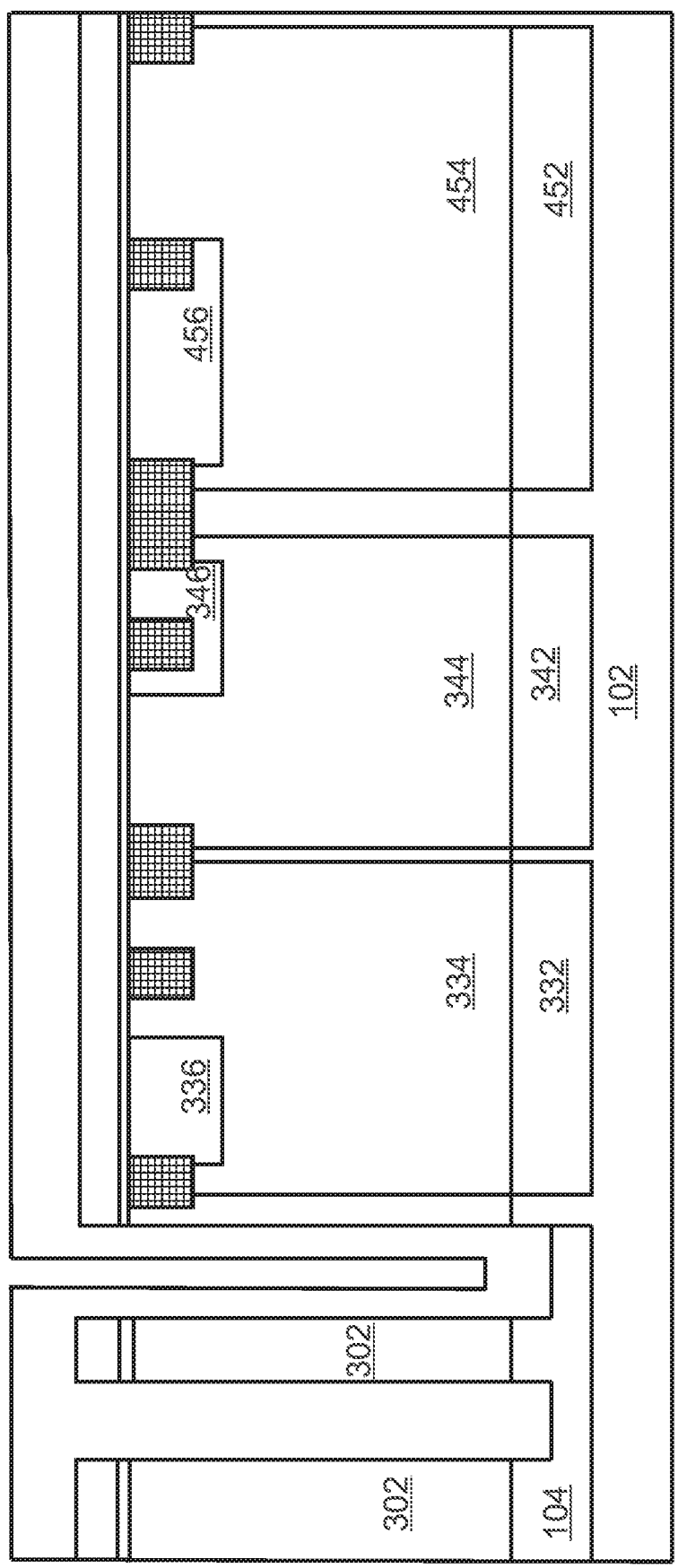
Figure 23:
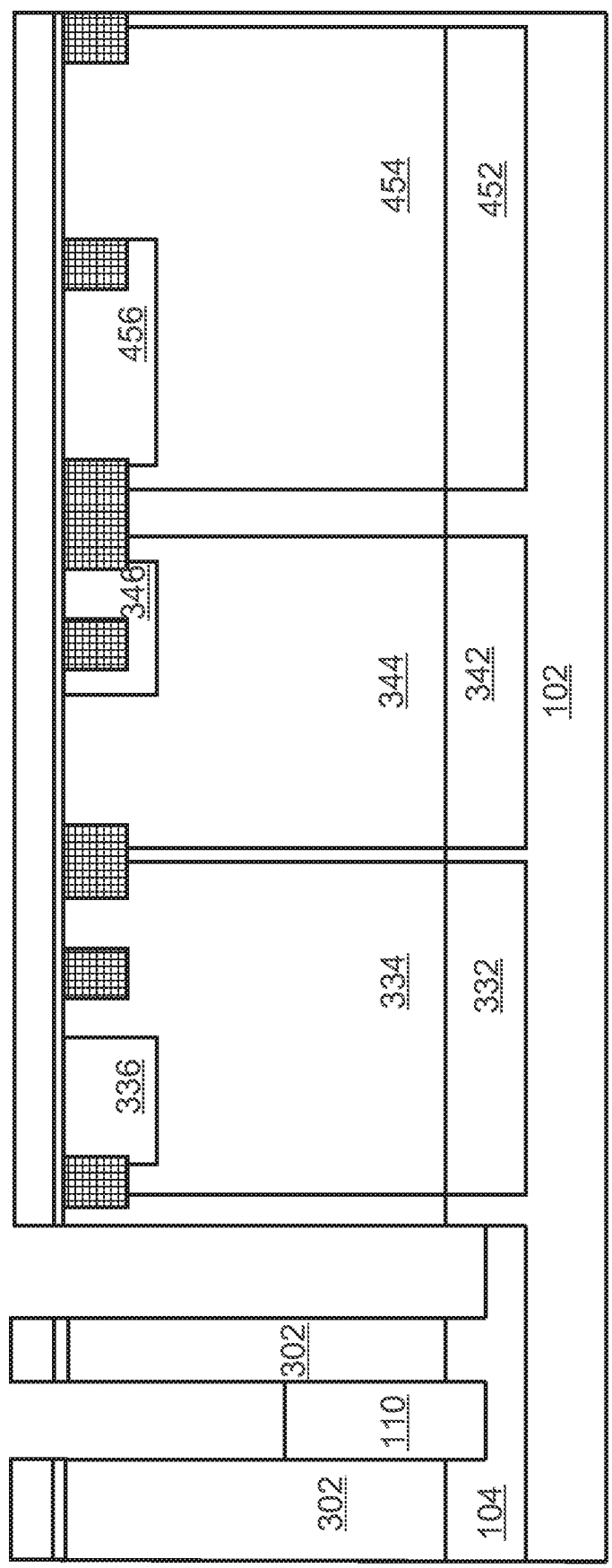
Figure 24:
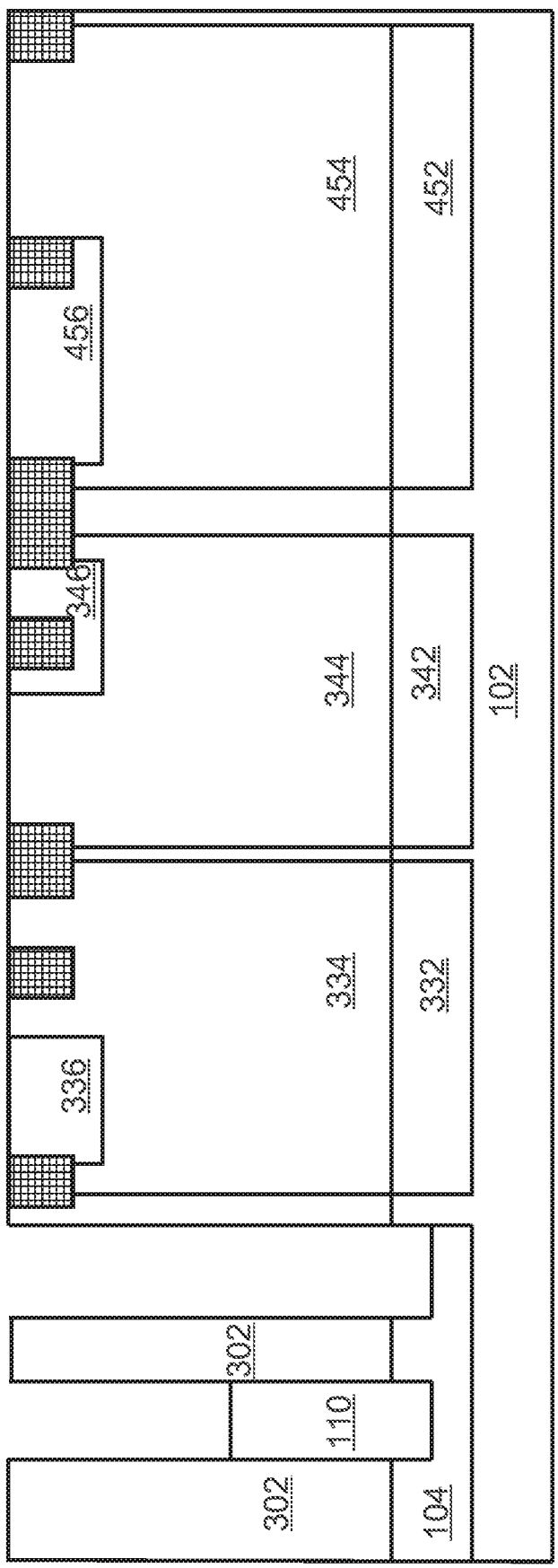
Figure 25:
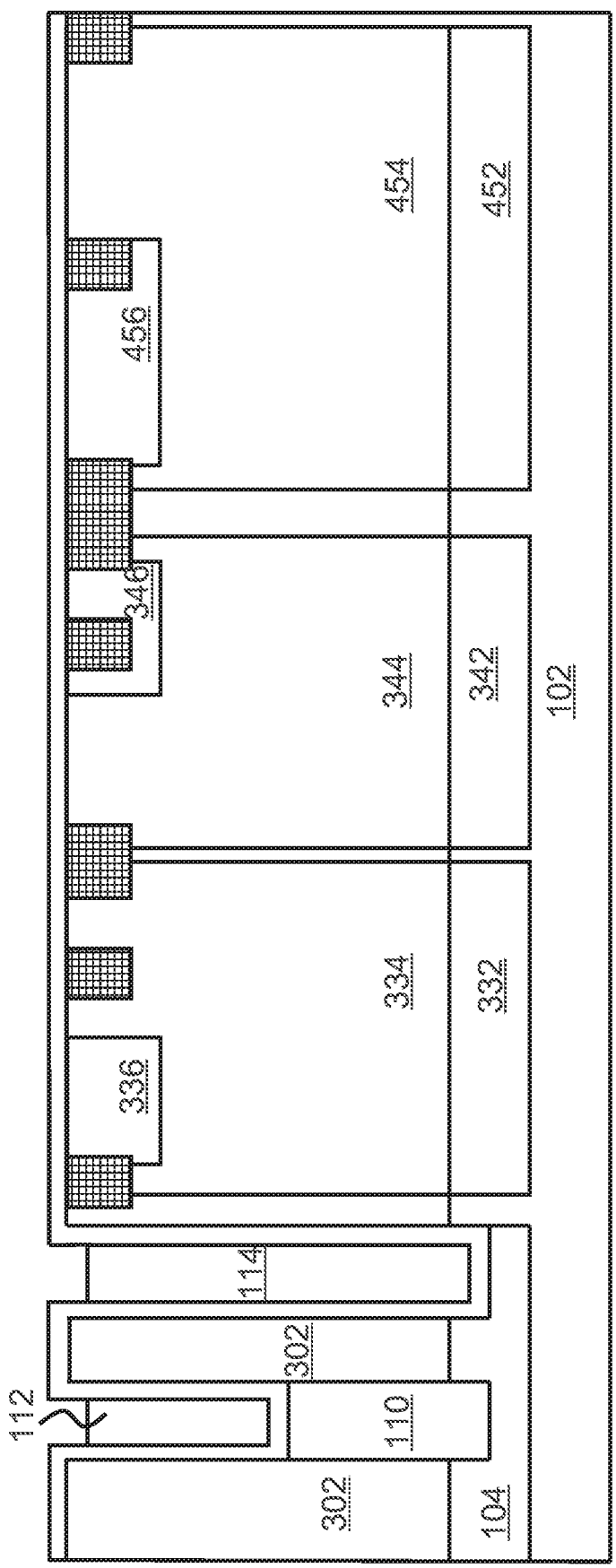
Figure 26:
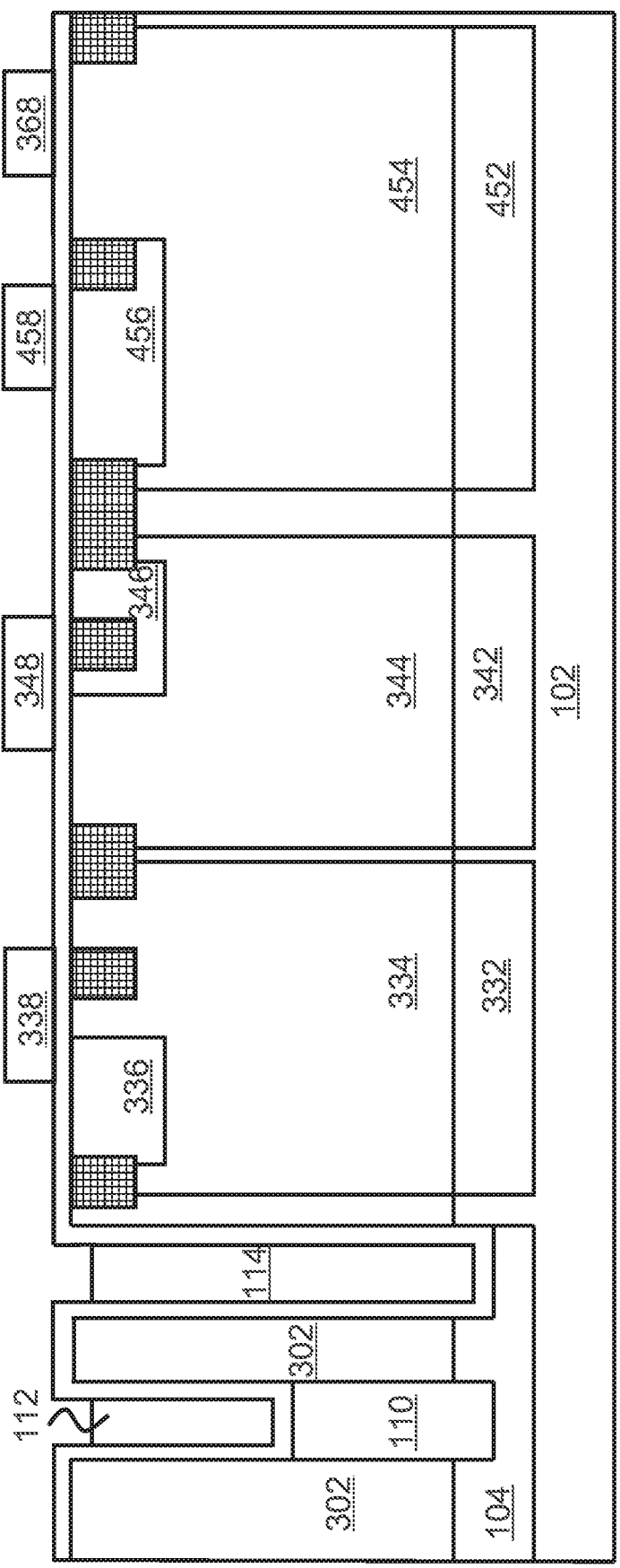
Figure 27:
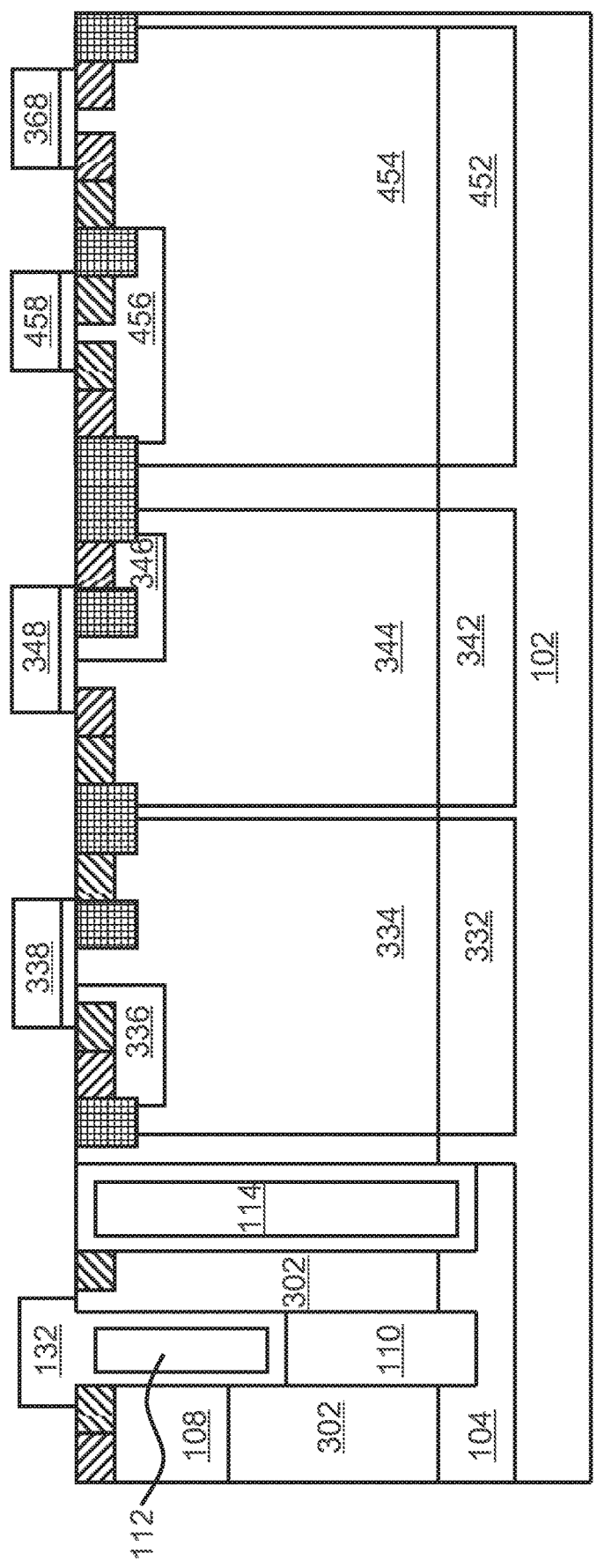

As shown in FIG. 16, the semiconductor device includes a plurality of NBL layers 104, 332, 342 and 452 formed in the substrate 102. Instead of having an N-type epitaxial layer 106 shown in FIG. 5, a P-type epitaxial layer 1602 is grown over the substrate 102. The P-type epitaxial layer 1602 is of a doping concentration in a range from about $10^{14}$/cm$^3$ to about $10^{17}$/cm$^3$.

FIG. 16 further illustrates a plurality of high voltage N-Wells 302, 334, 344 and 454 are formed in the P-type epitaxial layer 1602. The high voltage N-Wells 302, 334, 344 and 454 may be of a doping concentration in a range from about $10^{15}$/cm$^3$ to about $10^{18}$/cm$^3$. The fabrication process shown in FIGS. 16-27 is similar to the fabrication process shown above with respect to FIGS. 5-15, and hence is not discussed again herein.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a vertical transistor comprising:
        a first gate in a first trench, wherein the first gate comprises a dielectric layer and a gate region over the dielectric layer; and
        a second gate in a second trench;
    a high voltage lateral transistor immediately adjacent to the vertical transistor; and
    a low voltage lateral transistor, wherein the high voltage lateral transistor is between the vertical transistor and the low voltage lateral transistor.

2. The device of claim 1, wherein:
    a first drain/source region of the vertical transistor and a second drain/source region of the vertical transistor are formed on opposite sides of the first trench; and
    a bottom of the second gate is lower than a bottom of the gate region.

3. The device of claim 2, wherein:
    the high voltage lateral transistor and the second drain/source region are on opposite sides of the second trench.

4. The device of claim 2, further comprising:
    a first buried layer over a substrate;
    a first well over the first buried layer, wherein the first trench extends through the first well and extends partially through the first buried layer; and
    a body region formed in the first well, wherein the first drain/source region is in the body region, and the second drain/source region is in the first well.

5. The device of claim 4, wherein:
the substrate and the body region are of a first conductivity; and
the first buried layer and the first well are of a second conductivity.

6. The device of claim 4, wherein:
the high voltage lateral transistor and the low voltage lateral transistor are formed over the substrate.

7. The device of claim 1, wherein:
the second trench is of a same depth as the first trench.

8. The device of claim 1, wherein:
a width of the second trench is greater than a width of the first trench.

9. The device of claim 1, further comprising:
a second buried layer over a substrate; and
a second well over the second buried layer, wherein drain/source regions of the high voltage lateral transistor are in the second well.

10. A device comprising:
a vertical transistor over a substrate, wherein the vertical transistor comprises:
 a first gate structure in a first trench, wherein the first gate structure comprises a dielectric layer and a first gate region over the dielectric layer; and
 a second gate structure in a second trench, wherein the second gate structure comprises a second gate region;
a plurality of high voltage lateral transistors over the substrate; and
a plurality of low voltage lateral transistors over the substrate.

11. The device of claim 10, further comprising:
a first buried layer over the substrate;
a first well over the first buried layer, wherein the first trench extends through the first well and extends partially through the first buried layer;
a body region formed in the first well, wherein a first drain/source region of the vertical transistor is in the body region, and a second drain/source region of the vertical transistor is in the first well;
a second buried layer over the substrate;
a second well over the second buried layer, wherein drain/source regions of a high voltage lateral transistor of the plurality of high voltage lateral transistors are in the second well;
a third buried layer over the substrate; and
a third well over the third buried layer, wherein drain/source regions of the plurality of low voltage lateral transistors are in the third well.

12. The device of claim 11, wherein:
a bottom surface of the first well is substantially level with a bottom surface of the second well; and
the bottom surface of the first well is substantially level with a bottom surface of the third well.

13. The device of claim 11, wherein:
a bottom surface of the first buried layer is substantially level with a bottom surface of the second buried layer; and
the bottom surface of the first buried layer is substantially level with a bottom surface of the third buried layer.

14. The device of claim 10, wherein:
a width of the second trench is greater than a width of the first trench; and
the second trench is of a same depth as the first trench.

15. The device of claim 10, wherein:
the first gate region and the second gate region are formed of poly-silicon, and wherein a bottommost surface of the second gate region is lower than a bottommost surface of the first gate region.

16. A device comprising:
a vertical transistor comprising:
 a first gate in a first trench, wherein the first gate comprises a dielectric layer and a gate region over the dielectric layer; and
 a second gate in a second trench, wherein a bottom of the second trench is substantially level with a bottom surface of the first trench; and
a high voltage lateral transistor and a low voltage lateral transistor formed over a same substrate as the vertical transistor.

17. The device of claim 16, further comprising:
a first buried layer over a substrate;
a first well over the first buried layer, wherein the first trench extends through the first well and extends partially through the first buried layer;
a body region formed in the first well, wherein a first drain/source region of the vertical transistor is in the body region, and a second drain/source region of the vertical transistor is in the first well;
a second buried layer over the substrate;
a second well over the second buried layer, wherein drain/source regions of the high voltage lateral transistor are in the second well;
a third buried layer over the substrate; and
a third well over the third buried layer, wherein drain/source regions of the low voltage lateral transistor are in the third well.

18. The device of claim 17, wherein:
the first trench and the second trench extend through the first well and partially through the first buried layer.

19. The device of claim 17, wherein:
the first drain/source region and the second drain/source region are on opposite sides of the first trench; and
the second drain/source region and the high voltage lateral transistor are on opposite sides of the second trench.

20. The device of claim 16, wherein:
a width of the second trench is greater than a width of the first trench; and
the second trench is of a same depth as the first trench.

* * * * *